United States Patent
Nishizawa et al.

(10) Patent No.: US 8,426,238 B2
(45) Date of Patent: Apr. 23, 2013

(54) SOLID-STATE IMAGE PICKUP DEVICE, METHOD FOR MANUFACTURING THE SAME, AND ELECTRONIC APPARATUS

(75) Inventors: Kenichi Nishizawa, Kanagawa (JP); Hiroshi Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 12/892,007

(22) Filed: Sep. 28, 2010

(65) Prior Publication Data

US 2011/0079866 A1 Apr. 7, 2011

(30) Foreign Application Priority Data

Oct. 5, 2009 (JP) ................................. 2009-231462

(51) Int. Cl.
*H01L 21/00* (2006.01)

(52) U.S. Cl.
USPC ............... 438/70; 438/72; 438/59; 257/228; 257/233; 257/294; 257/432; 257/447; 257/E31.127; 257/E27.122; 257/E31.001

(58) Field of Classification Search .................. 257/228, 257/233, 294, 432, 447, E31.127, E27.122, 257/E31.001; 438/70, 72, 59
See application file for complete search history.

(56) References Cited

U.S. PATENT DOCUMENTS

2010/0237451 A1 * 9/2010 Murakoshi .................... 257/432

FOREIGN PATENT DOCUMENTS

| JP | 2003-031785 | 1/2003 |
|----|----|----|
| JP | 2004-172950 | 6/2004 |
| JP | 2006-054276 | 2/2006 |
| JP | 2006-093319 | 4/2006 |
| JP | 2006-157953 | 6/2006 |
| JP | 2007-053250 | 3/2007 |

* cited by examiner

*Primary Examiner* — Meiya Li
(74) *Attorney, Agent, or Firm* — SNR Denton US LLP

(57) ABSTRACT

A method for manufacturing a solid-state image pickup device is provided. A first pixel isolation member is formed in a semiconductor substrate including pixels by implanting impurity ions in a first region of the substrate to separate pixels in the first region from each other when viewed from a surface of the substrate. A second pixel isolation member is also formed in the substrate by forming a trench in a second region of the substrate different from the first region to separate pixels in the second region from each other, and filling the trench with an electroconductive material harder to polish by CMP than the substrate. The thickness of the substrate is reduced by CMP on a rear surface of the substrate using the second pixel isolation member as a stopper.

6 Claims, 20 Drawing Sheets

PA

SOLID-STATE IMAGE PICKUP DEVICE, METHOD FOR MANUFACTURING THE SAME, AND ELECTRONIC APPARATUS

BACKGROUND OF THE INVENTION

1. Field of the Invention

The present invention relates to a solid-state image pickup device, a method for manufacturing the same, and an electronic apparatus.

2. Description of the Related Art

Electronic apparatuses, such as digital video cameras and camera-equipped cellular phones, include solid-state image pickup devices.

The solid-state image pickup device has an image-pick up region including a plurality of pixels on a semiconductor substrate. Each pixel has a photoelectric conversion portion. The photoelectric conversion portion, which may be a photodiode, generates a signal charge by receiving light coming through an external optical system and converting the light to electricity.

A CMOS (complementary metal oxide semiconductor) image sensor can be used as the solid-state image pickup device.

The CMOS image sensor includes pixels, each including the photoelectric conversion portion and a set of transistors. The set of transistors acts as pixel transistors that read the signal charge generated from the photoelectric conversion portion and output the signal charge to a signal line as an electric signal. For example, pixel transistors including four transistors: a transfer transistor, a reset transistor, an amplification transistor and a selection transistor are provided on the surface of the semiconductor substrate. The transistors of the pixel transistor sets are electrically connected to conductor lines disposed on the surface of the semiconductor substrate.

The CMOS image sensor is generally of front emission type in which the photoelectric conversion portion receives light entering through the front side of the semiconductor substrate having conductor lines and pixel transistors. In the surface emission type, unfortunately, conductor lines are disposed in a plurality of layers in the path through which light enters the photoelectric conversion portion. Therefore the conductor lines in the plurality of layers may reduce the light use efficiency to reduce the sensitivity. Accordingly, a rear emission type is proposed which receives light entering through the rear side of the semiconductor substrate opposite the front side having conductor lines and pixel transistors (for example, Japanese Unexamined Patent Application Publication No. 2003-31785).

It is advantageous that the CMOS image sensor is more miniaturized and achieves high definition. In order to reduce the pixel size for miniaturization of the CMOS image sensor, a pixel structure is proposed in which a plurality of photoelectric conversion portions share the pixel transistors. For example, a technique is proposed in which a single pixel transistor set is provided for two or four photoelectric conversion portions (for example, Japanese Unexamined Patent Application Publication Nos. 2004-172950, 2006-157953 and 2006-54276).

In such a technique, a pixel isolation member is formed in the substrate to separate pixels from each other. For example, a shallow-trench oxide isolation (STI) structure is provided as the pixel isolation member in the semiconductor substrate. Alternatively, an impurity diffusion region, such as a p-well, is provided as the pixel isolation member in the semiconductor substrate (for example, Japanese Unexamined Patent Application Publication No. 2006-93319 and 2007-53250).

SUMMARY OF THE INVENTION

In the rear emission CMOS image sensor, the thickness of the semiconductor substrate is reduced from several hundred micrometers to, for example, 10 μm so that light can enter the photoelectric conversion portion. If variation in thickness occurs through the step of reducing the thickness, the intensity of incident light varies. In order to prevent the variation in thickness, silicon-on-insulator (SOI) substrate can be used in manufacture of rear emission CMOS image sensors.

FIGS. 19A and 19B and FIGS. 20A and 20B are sectional views showing a process for producing a rear emission CMOS image sensor. As shown in these figures, the rear emission CMOS image sensor is produced through steps (A) to (D) in that order.

First, an SOI substrate 101J is prepared, as shown in FIG. 19(A). More specifically, the SOI substrate 101J includes a thin silicon layer AS on a silicon substrate KB with a silicon oxide layer BOX therebetween.

Turning then to FIG. 19(B), a p-type impurity diffusion region PW, photodiodes 21J, a pixel isolation member PSJ acting as p-type wells, and n-type floating diffusion portions FD are formed in the silicon layer AS of the SOI substrate 101J.

In this instance, each element or member is formed by implanting impurity ions into the silicon layer. Then, after forming pixel transistors (not shown) including the transfer transistor on the silicon layer AS, a multilayer wiring layer HS is formed in the silicon layer AS by embedding conductor lines HT in an insulating interlayer SZ.

Subsequently, a support substrate SK is bonded onto the multilayer wiring layer HS, as shown in FIG. 20A.

Turning to FIG. 20B, the silicon substrate KB of the SOI substrate 101J is removed.

For example, the silicon substrate KB can be removed by applying a technique for reducing thickness, such as chemical mechanical polishing (CMP), with the SOI substrate 101J inverted. For CMP, the silicon oxide layer BOX of the SOI substrate 101J acts as a CMP stopper with which the end point of CMP can be detected.

Then, the silicon oxide layer BOX is removed to expose the rear surface of the silicon layer AS by wet etching. Part of the silicon layer AS is removed from the rear side until the p-type impurity diffusion region PW is exposed. Then, the surface of the silicon layer AS is provided with a passivation layer (not shown), a color filter (not shown) and an on-chip lens (not shown). Thus, a rear emission CMOS image sensor is completed.

When the SOI substrate 101J is used as described above, the silicon oxide layer BOX acts as a stopper in the step of reducing the thickness, thus preventing the variation in thickness.

However, the SOI substrate 101J is expensive, and the use of the SOI substrate 101J undesirably increases the manufacturing cost. On the other hand, it may be difficult to prevent the thickness of the substrate from varying in the step of reducing the thickness when a substrate other than the SOI substrate is used.

In addition, if impurity ions are implanted into the silicon layer AS to form the pixel isolation member PSJ as described above, the pixel isolation region PSJ is formed to a large depth at a high density for further miniaturizing the pixels. In this instance, a resist pattern used as a mask for ion implantation is formed in a thick fine shape. Accordingly, the resist pattern may fall down due to stress. Efficient manufacture of rear surface emission CMOS image sensors may be difficult in some cases.

As described above, in manufacture of some types of solid-state image pickup device, it may be difficult to reduce the cost and to enhance the productivity. For this reason, it may be difficult to enhance the quality of taken images.

Accordingly, it is desirable to provide a solid-state image pickup device and an electronic apparatus that can be efficiently manufactured at low cost and can take high-quality images, and a method for efficiently manufacturing the solid-state image pickup device at low cost.

According to an embodiment of the present invention, a method is provided for manufacturing a solid-state image pickup device. The method includes the steps of forming a pixel isolation member in a semiconductor substrate in which a plurality of pixels each including a photoelectric conversion element are arranged, and reducing the thickness of the semiconductor substrate by chemical mechanical polishing of the semiconductor substrate. The step of forming a pixel isolation member includes the sub steps of forming a first pixel isolation member by implanting impurity ions in a region of the semiconductor substrate so that the pixels are disposed between portions of the region when viewed from a surface of the semiconductor substrate, and forming a second isolation member by forming a trench in a region of the semiconductor substrate different from the first pixel isolation member so that the pixels are disposed between portions of the region, and then filling the trench with an electroconductive material harder to polish by chemical mechanical polishing than the semiconductor substrate. The step of reducing the thickness is performed by chemical mechanical polishing of a rear surface of the semiconductor substrate using the second pixel isolation member as a stopper.

According to another embodiment of the present invention, a solid-state image pickup device is provided which includes a pixel isolation member in a semiconductor substrate including a plurality of pixels, each including a photoelectric conversion element. The pixel isolation member includes a first pixel isolation member formed by implanting impurity ions in a region of the semiconductor substrate so that the pixels are disposed between portions of the region when viewed from a surface of the semiconductor substrate, and a second pixel isolation member formed by filling a trench with an electroconductive material. The trench is formed in a region different from the first pixel isolation member so that the pixels are disposed between portions of the region when viewed from the surface of the semiconductor substrate.

According to another embodiment of the present invention, an electronic apparatus is provided which includes a pixel isolation member in a semiconductor substrate including a plurality of pixels, each including a photoelectric conversion element. The pixel isolation member includes a first pixel isolation member formed by implanting impurity ions in a region of the semiconductor substrate so that the pixels are disposed between portions of the region when viewed from a surface of the semiconductor substrate, and a second pixel isolation member formed by filling a trench with an electroconductive material. The trench is formed in a region different from the first pixel isolation member so that the pixels are disposed between portions of the region when viewed from the surface of the semiconductor substrate.

In embodiments of the invention, a pixel isolation member is formed in a semiconductor substrate including a plurality of pixels, each including a photoelectric conversion element. The thickness of the semiconductor substrate is reduced by chemical mechanical polishing (CMP). For forming the first pixel isolation member, impurity ions are implanted into a region of the semiconductor substrate so that pixels are disposed between the portions of the region when viewed from a surface of the substrate. Also, the second pixel isolation member is formed in a different region from the first isolation member so that the pixels are disposed between portions of the region when viewed from the surface of the semiconductor substrate. For forming the second pixel isolation member, a trench is formed in a region of the semiconductor substrate in which the second pixel isolation member is to be formed, and then the trench is filled with an electroconductive material harder to polish by CMP than the semiconductor substrate. For reducing the thickness of the semiconductor substrate, CMP is performed on the rear surface of the semiconductor substrate using the second pixel isolation member as a CMP stopper.

The present invention can provide a solid-state image pickup device and an electronic apparatus that can be efficiently manufactured at low cost and can take high-quality images, and methods for efficiently manufacturing the solid-state image pickup device and the electronic apparatus.

DESCRIPTION OF THE PREFERRED EMBODIMENTS

The present invention will be further described using exemplary embodiments with reference to the drawings.

The description will be made in the following order:
1. First embodiment
2. Second embodiment
3. Modifications

1. First Embodiment (A) Structure (A-1) Structure of Principal Part of Camera FIG. 1 is a block diagram of a camera 40 according to a first embodiment of the present invention.

Figure 1:
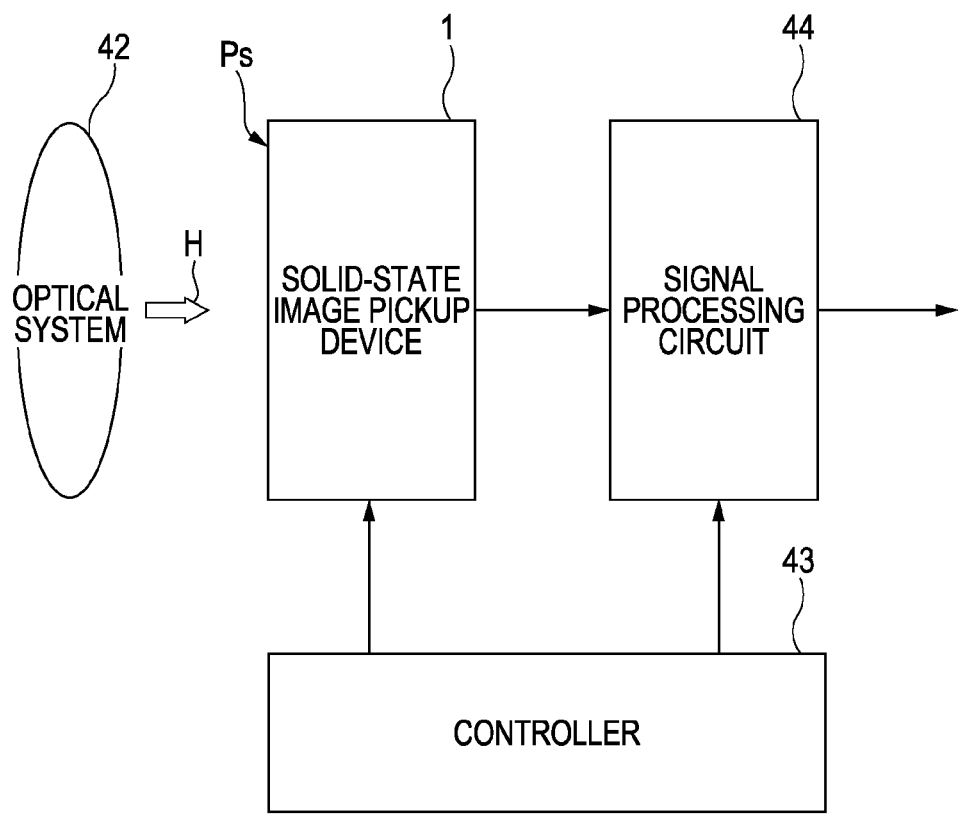
FIG. 1 is a block diagram of a camera 40 according to a first embodiment of the present invention.

As shown in FIG. 1, the camera 40 includes a solid-state image pickup device 1, an optical system, 42, a controller 43, and a signal processing circuit 44. These elements will be described one by one.

The solid-state image pickup device 1 receives light (subject image) H coming through the optical system 42 at an image pickup face Ps and converts the light into electricity to generate a signal charge. In the present embodiment, the solid-state image pickup device 1 is operated according to control signals output from the controller 43. More specifically, the solid-state image pickup device 1 reads out the signal charge and output it as raw data.

The optical system 42 includes optical members, such as an image-forming lens and an iris, which are arranged so that the light H of the subject image is focused on the image pickup face Ps of the solid-state image pickup device 1.

The controller 43 outputs signals to the solid-state image pickup device 1 and the signal processing circuit 44 to control and operate the solid-state image pickup device 1 and the signal processing circuit 44.

The signal processing circuit 44 is configured to process raw data output from the solid-state image pickup device 1 to form the digital image of a subject image.

(A-2) Structure of Principal Part of Solid-State Image Pickup Device

The entire structure of the solid-state image pickup device 1 will now be described.

Figure 2:
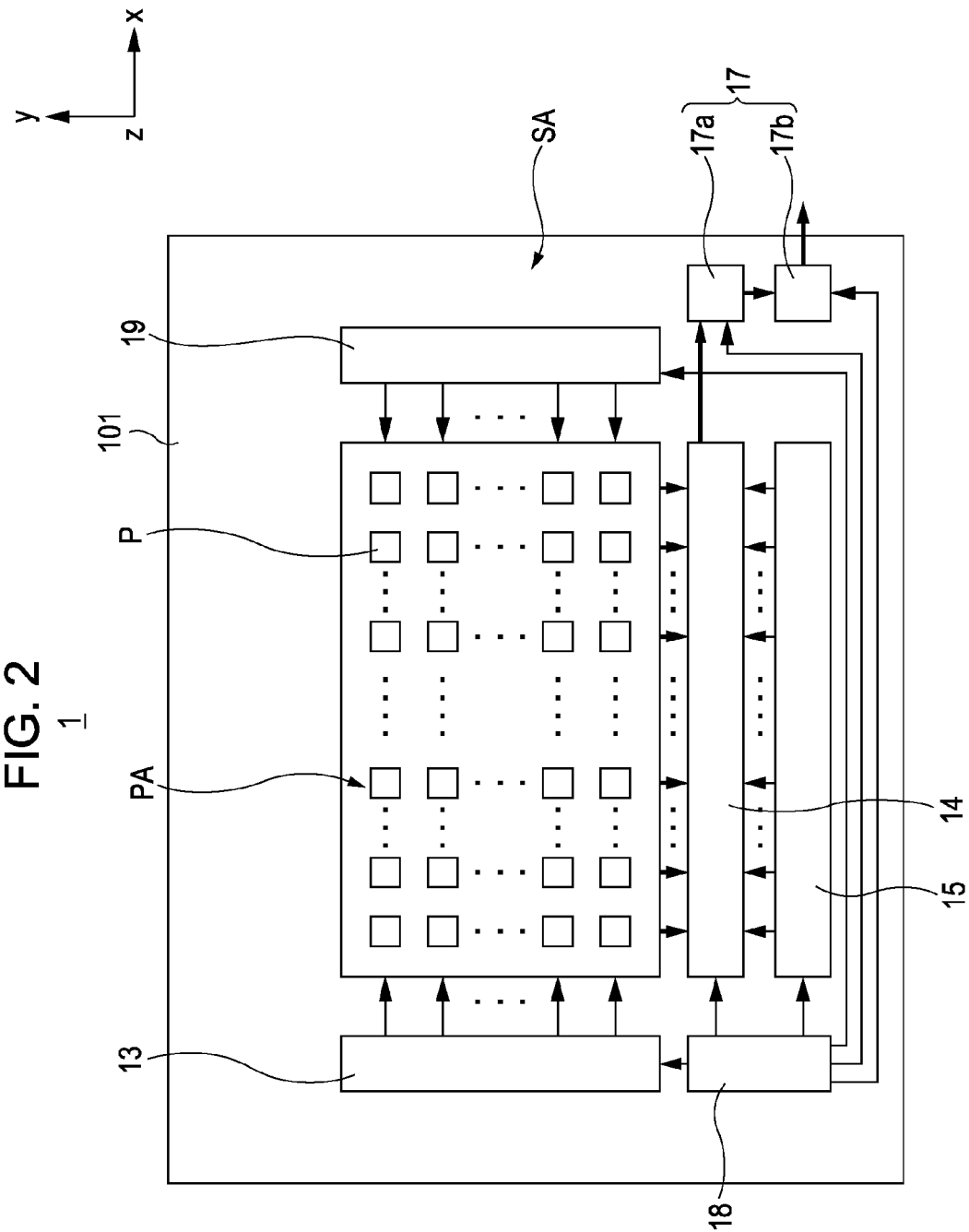
FIG. 2 is a block diagram of the entire structure of an image pickup device 1 according to the first embodiment of the present invention.

FIG. 2 is a block diagram of the entire structure of the image pickup device 1 of the first embodiment of the present invention.

The solid-state image pickup device 1 of the present embodiment is a CMOS image sensor, and includes a substrate 101, as shown in FIG. 2. The substrate 101 is a semiconductor substrate made of, for example, silicon, and on the surface of which an image pickup region PA and an outer region SA are provided, as shown in FIG. 2.

The image pickup region PA is rectangular, as shown in FIG. 2, and in which a plurality of pixels P are arrayed in the horizontal direction x and the vertical direction y. Hence the pixels P are arranged in a matrix manner. The image pickup region PA is disposed so that its center is aligned with the optical axis of the optical system 42 shown in FIG. 1. The image pickup region PA corresponds to the image pickup face Ps shown in FIG. 1.

In the image pickup region PA, the pixels P receive incident light to generate a signal charge. Pixel transistors read and output the generated signal charge. Details of the structure of the pixel P will be described later.

The outer region SA lies around the image pickup region PA, as shown in FIG. 2. In the outer region SA, peripheral circuits are disposed.

More specifically, a vertical drive circuit 13, a column circuit 14, a horizontal drive circuit 15, an external output circuit 17, a timing generator (TG) 18, and a shutter drive circuit 19 are disposed as the peripheral circuits, as shown in FIG. 2.

The vertical drive circuit 13 is disposed in the outer region SA along a side of the image pickup region PA, and is configured to select pixels P by the row in the image pickup region PA and drive the selected pixels.

The column circuit 14 is disposed in the outer region SA along a lower side (shown in FIG. 2) of the image pickup region PA, and processes signals output from the pixels P by the column. In the present embodiment, the column circuit 14 includes a correlated double sampling (CDS) circuit, and removes fixed pattern noises.

The horizontal drive circuit 15 is electrically connected to the column circuit 14, as shown in FIG. 2. The horizontal drive circuit 15, which includes, for example, a shift resister, outputs the signals of the pixels stored column by column in the column circuit 14 to the external output circuit 17 one after another.

The external output circuit 17 is electrically connected to the column circuit 14, as shown in FIG. 2, and processes the signal output from the column circuit 14 and outputs the processed signal. The external output circuit 17 includes an automatic gain control (AGC) circuit 17a and an analog-to-digital converter (ADC) circuit 17b. In the external output circuit 17, the AGC circuit 17a applies a gain to the signal, and, then, the ADC circuit 17b converts the analog signal to a digital signal and outputs the digital signal outside.

The timing generator 18 is electrically connected to the vertical drive circuit 13, the column circuit 14, the horizontal drive circuit 15, the external output circuit 17 and the shutter drive circuit 19, as shown in FIG. 2. The timing generator 18 generates timing signals and outputs them to the vertical drive circuit 13, the column circuit 14, the horizontal drive circuit 15, the external output circuit 17 and the shutter circuit 19 to control their operations.

The shutter drive circuit 19 is configured to select pixels P by the row to adjust the exposure time of the selected pixels P.

(A-3) Structure of Image Pickup Device

The solid-state image pickup device 1 will be further described in detail.

Figure 3:
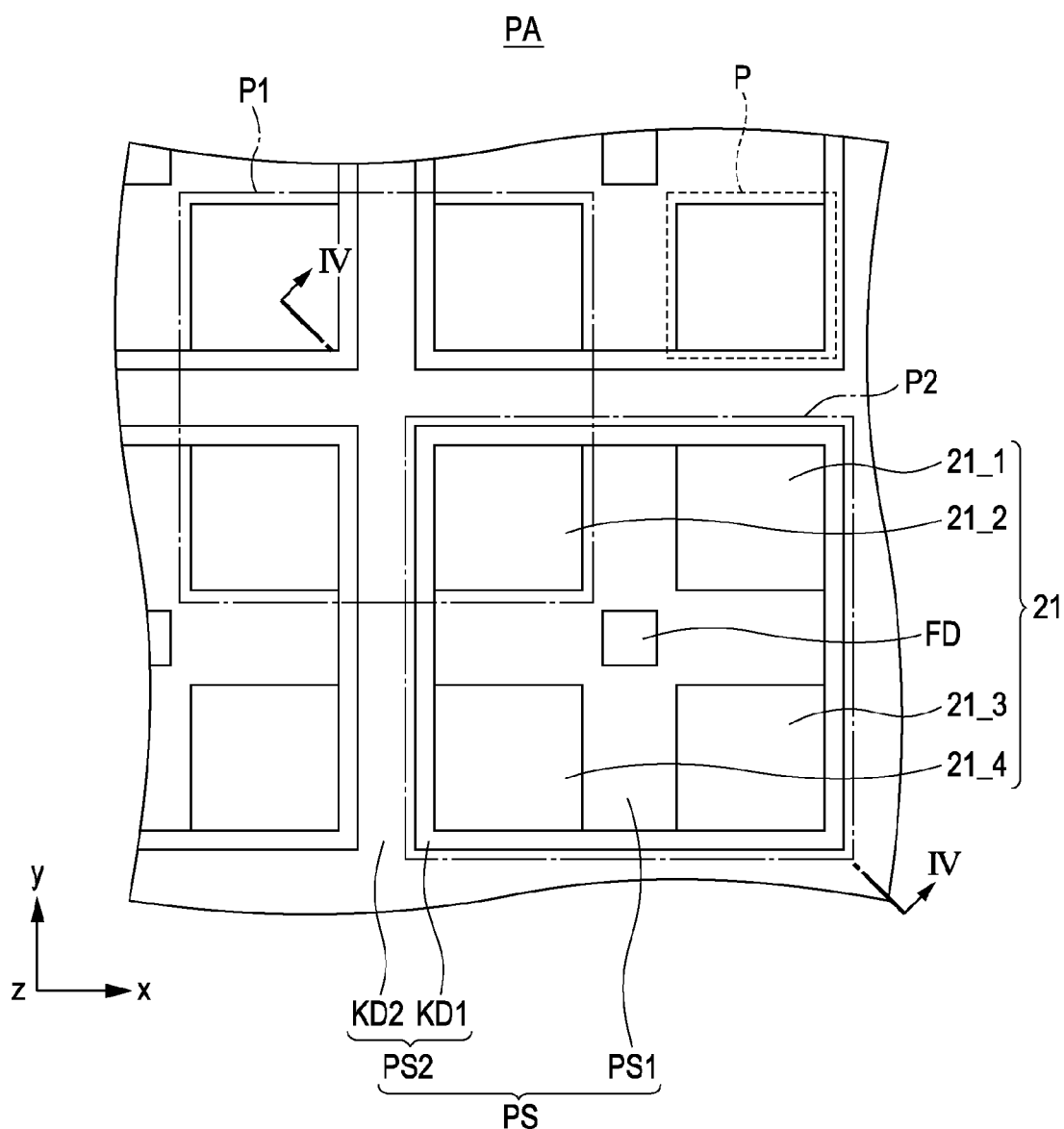
FIG. 3 is a fragmentary view of a principal part of the image pickup device 1 according to the first embodiment of the present invention.
Figure 4:
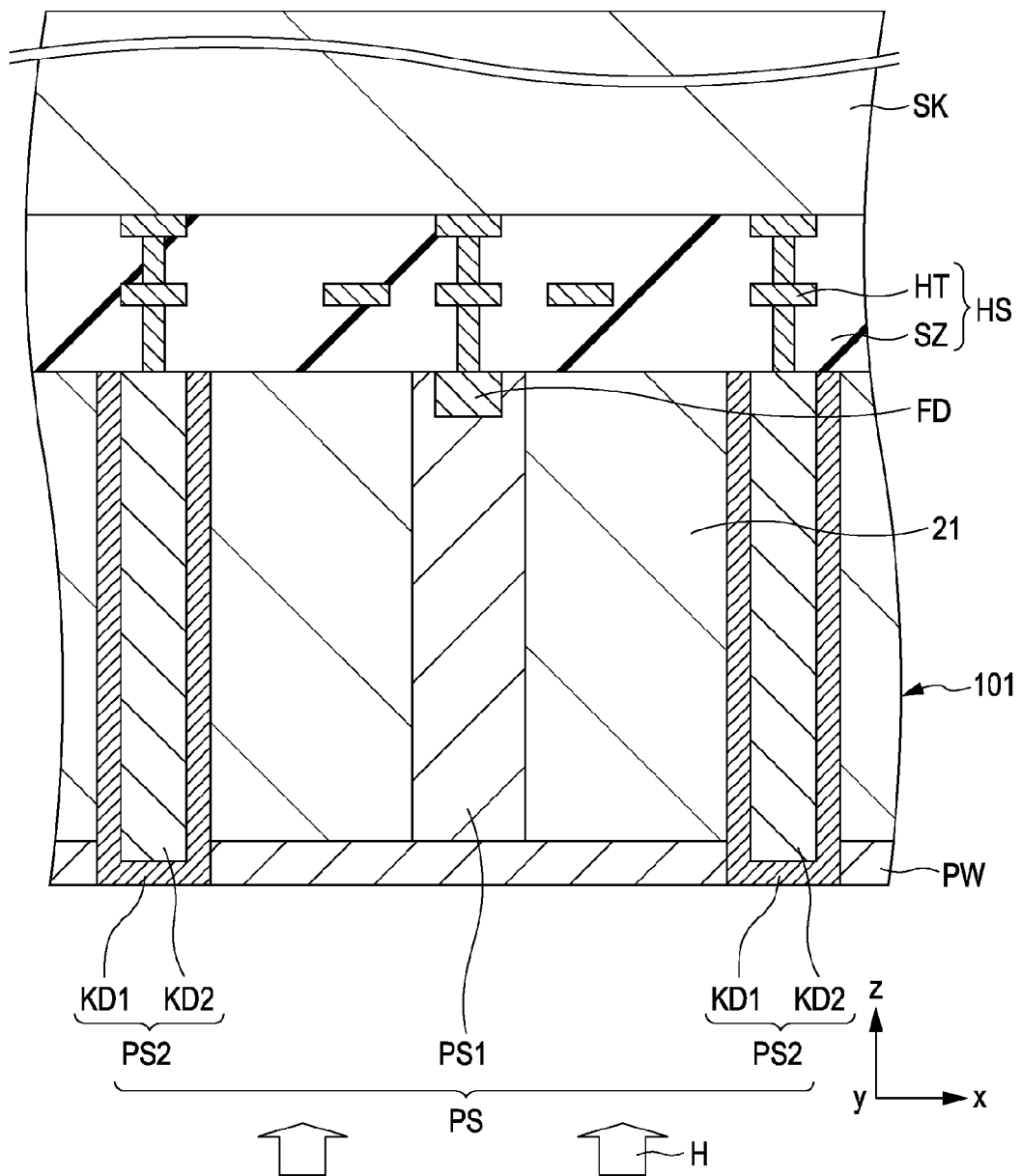
FIG. 4 is a fragmentary view of a principal part of the image pickup device 1 according to the first embodiment of the present invention.
Figure 5:
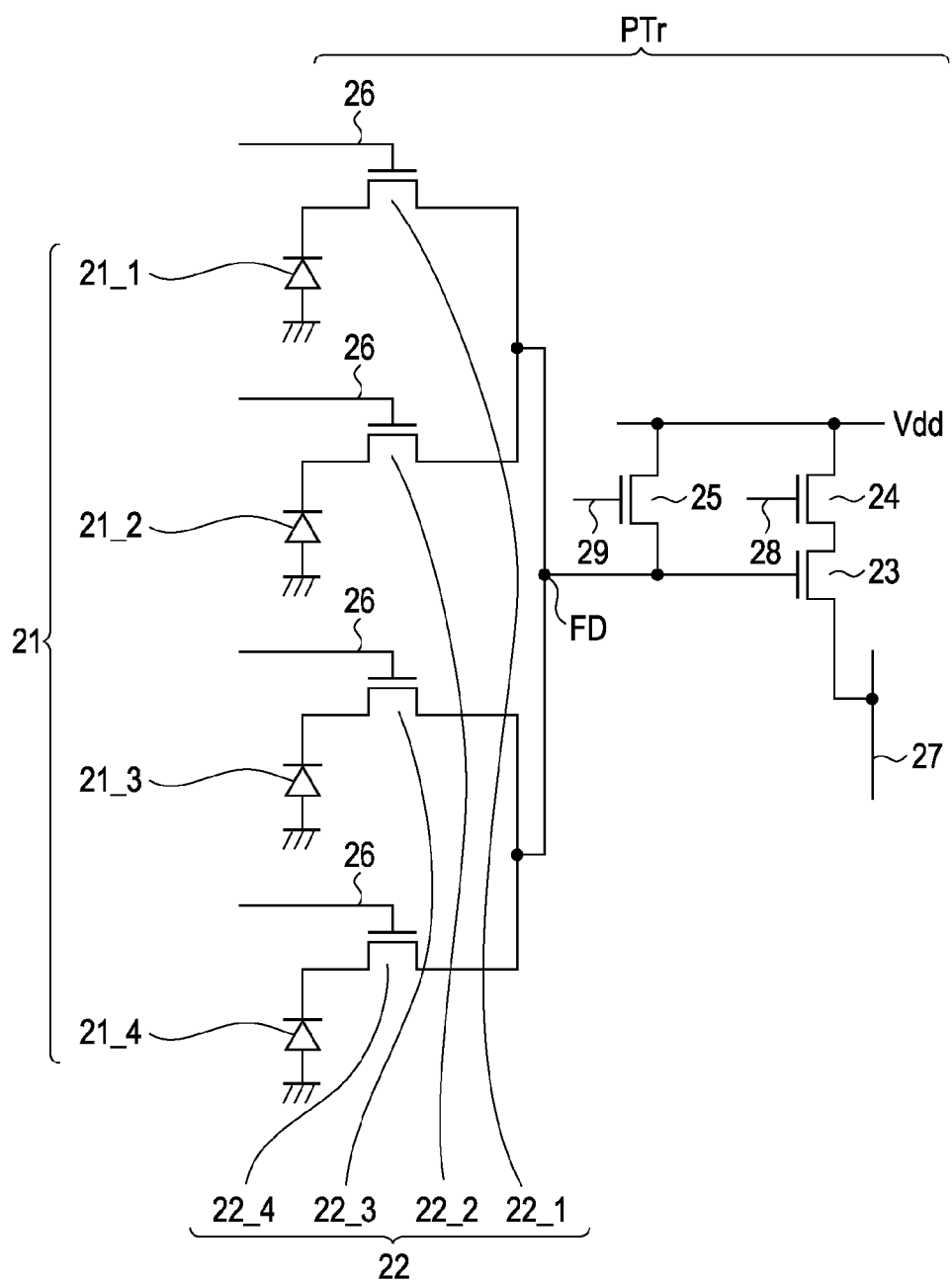
FIG. 5 is a fragmentary diagram of a principal part of the image pickup device 1 according to the first embodiment of the present invention.

FIGS. 3 to 5 show a principal part of the solid-state image pickup device 1 of the present embodiment.

FIG. 3 is a schematic top view of a principal part of the image pickup region PA. FIG. 4 is a schematic sectional view of the principal part of the image pickup region PA. FIG. 5 is a circuit diagram of the pixels P in the image pickup region PA. FIG. 3 shows the substrate 101 shown in FIG. 4. FIG. 4 shows the section taken along line IV-IV in FIG. 3.

As shown in FIGS. 3 to 5, the solid-state image pickup device 1 includes photodiodes 21, pixel transistors PTr, pixel isolation members PS and a multilayer wiring layer HS. In the present embodiment, the pixel isolation members PS include a first pixel isolation member PS1 and a second pixel isolation member PS2. The pixel transistors PTr include a transfer transistor 22, an amplification transistor 23, a selection transistor 24 and a reset transistor 25, as shown in FIG. 5.

The solid-state image pickup device 1 of the present embodiment, which is of so-called rear emission type, is configured so that the photodiode 21 receives light H entering the substrate 101 from the lower surface (rear side) of the substrate opposite to the upper surface (front side) of the multilayer wiring layer HS. More specifically, the substrate 101 has been thinned to a thickness of, for example, 2 to 10 μm, so that the photodiode 21 can receive light from the rear side.

Elements of the solid-state image pickup device will now be described one by one in detail.

(A-3-1) Photodiode 21

In the solid-state image pickup device 1, a plurality of photodiodes 21 are provided according to the respective pixels P, as shown in FIG. 3. The plurality of photodiodes 21 are arranged in the horizontal direction x and the vertical direction y perpendicular to the horizontal direction x when viewed from the image pickup face (xy face). The photodiodes 21 have the same shape in the horizontal direction x and the vertical direction y and are arranged at regular intervals. In the present embodiment, the photodiodes 21 are disposed in respective unit pixel regions partitioned by the pixel isolation members PS when viewing the image pickup face (xy face).

As shown in FIG. 4, the photodiodes 21 are embedded in the silicon semiconductor substrate 101. Each photodiode 21 receives incident light (subject image) and converts the light into electricity to generate and store a signal charge. More specifically, the photodiode 21 is defined in the substrate 101 by an n-type charge storage region (not shown) and a shallow p-type impurity diffusion region (not shown) formed above the p-type impurity diffusion region PW.

The photodiodes 21 are configured so that each of the photodiodes 21 reads out the signal charge stored in the pixel transistors PTr, as shown in FIG. 5.

In the present embodiment, each photodiode 21 is provided with a transfer transistor 22, which is one of the pixel transistors PTr, as shown in FIG. 5. The transfer transistor 22 transmits the signal charge to the floating diffusion portion FD. In the present embodiment, four transfer transistors 22 (22_1, 22_2, 22_3 and 22_4) are provided corresponding to four photodiodes 21 (21_1, 21_2, 21_3 and 21_4), respectively, as shown in FIG. 5.

The plurality of photodiodes 21 share a single floating diffusion portion FD, as shown in FIG. 5. In the present embodiment, a single floating diffusion portion FD is provided for the four photodiodes 21 (21_1, 21_2, 21_3 and 21_4).

The set of those photodiodes 21 is provided with common pixel transistors PTr including an amplification transistor 23, a selection transistor 24 and a reset transistor 25. In the present embodiment, the set of the four photodiodes 21 (21_1, 21_2, 21_3 and 21_4) is provided with an amplification transistor 23, a selection transistor 24 and a reset transistor 25.

(A-3-2) Pixel Transistors PTr

In the solid-state image pickup device 1, the pixel transistors PTr, which are not shown in FIG. 3 or 4, are formed at the surface of the substrate 101 shown in FIG. 4 and covered with a multilayer wiring layer HS.

The transfer transistor 22 of the pixel transistors PTr is configured so as to read out the signal charge generated in the photodiode 21 to the floating diffusion portion FD, as shown in FIG. 5.

More specifically, the transfer transistor 22 transmits the signal charge stored in the photodiode 21 to the floating diffusion portion FD as an output signal when a transmission signal has been applied to the gate of the transistor 22 through a transfer line 26.

In the present embodiment, the transfer transistors 22 are provided corresponding to the respective photodiodes 21, as shown in FIG. 5. More specifically, four transfer transistors 22_1, 22_2, 22_3 and 22_4 are provided to the four photodiodes 21_1, 21_2, 21_3 and 21_4, respectively.

The transfer transistors 22, which are now shown in FIG. 3 or 4, are formed in such a manner that their transfer gates lie between the photodiodes 21 and the floating diffusion portion FD when viewed from the surface of the substrate 101. For example, the respective transfer gates of the four transfer transistors 22 are disposed so as to surround a single floating diffusion portion FD.

The amplification transistor 23 of the pixel transistors PTr amplifies electrical signals output from the transfer transistors 22 and outputs the amplified signals, as shown in FIG. 5.

More specifically, the gate of the amplification transistor 23 is connected to the floating diffusion portion FD. One of the terminals of the amplification transistor 23 is connected to the selection transistor 24, and the other is connected to a vertical signal line 27. When the selection transistor 24 has been selected so as to come into an on-state, the amplification transistor 23 receives a constant current from a constant current source (not shown) to act as a source follower. Thus, the amplification transistor 23 amplifies the signal output from the floating diffusion portion FD when the selection transistor 24 has received a selection signal.

In the present embodiment, the amplification transistor 23 is provided for each set composed of four photodiodes 21 (21_1, 21_2, 21_3 and 21_4), as shown in FIG. 5.

The selection transistor 24 of the pixel transistors PTr outputs the electrical signal from the amplification transistor 23 to the vertical signal line 27, as shown in FIG. 5, when a selection signal has been input to the selection transistor 24.

More specifically, the gate of the selection transistor 24 is connected to an address line 28 through which the selection signal is transmitted, as shown in FIG. 5. When a selection signal has been applied to the selection transistor 24, the selection transistor 24 comes into an on-state, so that the output signal amplified by the amplification transistor 23 is output to the vertical signal line 27.

In the present embodiment, a single selection transistor 24 is provided for the set of four photodiodes 21 (21_1, 21_2, 21_3 and 21_4), as shown in FIG. 5.

The reset transistor 25 of the pixel transistors PTr is configured so as to reset the gate potential of the amplification transistor 23, as shown in FIG. 5.

More specifically, the gate of the reset transistor 25 is connected to a reset line 29 through which a reset signal is transmitted, as shown in FIG. 5. Also, the drain of the reset transistor 25 is connected to a power source potential line Vdd, and the source is connected to the floating diffusion portion FD. When a reset signal has been applied to the gate of the reset transistor 25 from the reset line 29, the reset transistor 25 resets the gate potential of the amplification transistor 23 to the power source potential through the floating diffusion portion FD.

In the present embodiment, the reset transistor 25 is provided for the set of four photodiodes 21 (21_1, 21_2, 21_3 and 21_4), as shown in FIG. 5.

(A-3-3) Pixel Isolation Members PS

In the solid-state image pickup device 1, the pixel isolation members PS are disposed between the lines of the pixels P running in the horizontal direction x and between the lines of the pixels P running in the vertical direction y so as to separate the pixels P from each other, as shown in FIG. 3.

The pixel isolation members PS extend in the depth direction from the surface of the substrate 101 so as to separate the respective photodiodes 21 of the pixels P from each other, as shown in FIG. 4.

In the present embodiment, the pixel isolation members PS include a first pixel isolation member PS1 and a second pixel isolation member PS2, as shown in FIGS. 3 and 4.

The first pixel isolation member PS1 is formed in a grid manner so as to partition first pixel array regions P1, each in which pixels P are arranged two by two in the horizontal direction x and the vertical direction y when viewed from the image pickup face (xy face), as shown in FIG. 3.

More specifically, the first pixel isolation member PS1 includes horizontal portions extending in the horizontal direction x in such a manner that two pixels P lie between the horizontal portions arranged in the vertical direction y. The first pixel isolation member PS1 also includes vertical portions extending in the vertical direction y in such a manner that two pixels P in the horizontal direction x lie between the vertical portions. Hence, the first pixel isolation member PS1 includes the horizontal portions extending in the horizontal direction x and the vertical portions extending in the vertical direction y, and the horizontal portions and the vertical portions are arranged at a pitch of 2 pixels in the respective directions.

In the present embodiment, the first pixel isolation member PS1 is a p well, and is formed from the surface of the substrate 101 in the depth direction by implanting p-type impurity ions into the silicon semiconductor substrate 101, as shown in FIG. 4.

As shown in FIGS. 3 and 4, the first pixel isolation member PS1 has the floating diffusion portions FD at the intersections of the horizontal portions extending in the horizontal direction x and the vertical portions extending in the vertical direction y. The floating diffusion portion FD is formed in the first pixel isolation member PS1 in the upper surface of the substrate 101, as shown in FIG. 4. For example, the floating diffusion portion FD is formed by implanting p-type impurity ions into the first pixel isolation member PS1.

The second pixel isolation member PS2 is formed so as to partition second pixel array regions P2, each in which pixels P are arranged two by two in the horizontal direction x and the vertical direction y when viewed from the image pickup face (xy face), as shown in FIG. 3.

More specifically, the second pixel isolation member PS2 includes horizontal portions extending in the horizontal direction x in such a manner that two pixels P lies between the horizontal portions arranged in the vertical direction y. The second pixel isolation member PS2 also includes vertical portions extending in the vertical direction y in such a manner that two pixels P lie between the vertical portions arranged in the horizontal direction x. Hence, the second pixel isolation member PS2 includes the horizontal portions extending in the horizontal direction x and the vertical portions extending in the vertical direction y, and the horizontal portions and the vertical portions are arranged at a pitch of 2 pixels in the respective directions.

The second pixel isolation member PS2 is formed so as to partition second pixel array regions P2 that are shifted by the width of the pixel P (at a pitch of one pixel) in the horizontal direction x and the vertical direction y with respect to the first pixel array regions P1 when viewed from the image pickup face (xy face).

Thus, the horizontal portions of the first pixel isolation member PS1 are each disposed between the horizontal portions of the second pixel isolation member PS2 arranged in the vertical direction y. Also, the vertical portions of the first pixel isolation member PS1 are each disposed between the vertical portions of the second pixel isolation member PS2 arranged in the horizontal direction x.

The second pixel isolation member PS2 passes through the thickness of the substrate 101, as shown in FIG. 4.

Unlike the first pixel isolation member PS1, the second pixel isolation member PS2 is made of an electroconductive material. Hence, the second pixel isolation member PS2 acts as a through-electrode.

More specifically, the second pixel isolation member PS2 includes a first metal layer KD1 and a second metal layer KD2.

The first metal layer KD1 of the second pixel isolation member PS2 is formed so as to surround each second pixel array region P2, as shown in FIG. 3. In addition, the first metal layer KD1 covers the second metal layer KD2 in the substrate 101, as shown in FIG. 4.

The second metal layer KD2 of the second pixel isolation member PS2 is formed between portions of the first metal layer KD1 around the second pixel array regions P2, as shown in FIG. 3. In addition, the second metal layer KD2 is covered with the first metal layer KD2 in the substrate 101, as shown in FIG. 4.

The first metal layer KD1 acts a so-called barrier metal layer, and prevents the second metal layer KD2 made of, for example, copper from diffusing into the substrate 101.

(A-3-4) Multilayer Wiring Layer HS

In the solid-state image pickup device 1, the multilayer wiring layer HS is formed on the surface of the substrate 101, as shown in FIG. 4. The multilayer wiring layer HS includes conductor lines HT and an insulating interlayer SZ. The conductor lines HT are disposed in the insulating interlayer SZ, and electrically connected to the pixel transistors PTr. In other words, the conductor lines HT act as conductor lines shown in FIG. 5, such as the transfer line 26, the address line 28, the vertical signal line 27 and the reset line 29.

(A-3-5) Others

In addition, the substrate 101 has optical members, such as on-chip lenses (not shown) and color filters (not shown), corresponding to the respective pixels P. Since the solid-state image pickup device 1 of the present embodiment is of rear emission type, those optical members are provided at the rear side of the substrate 101. The solid-state image pickup device 1 is configured so that the photodiode 21 receives light coming through optical members, such as the on-chip lens and the color filter.

(B) Manufacturing Method

A method for manufacturing the solid-state image pickup device 1 will now be described.

FIGS. 6A to 13 are views of principal parts formed in respective steps of the method for manufacturing the solid-state image pickup device 1 of the first embodiment. In FIGS.

Figure 11:
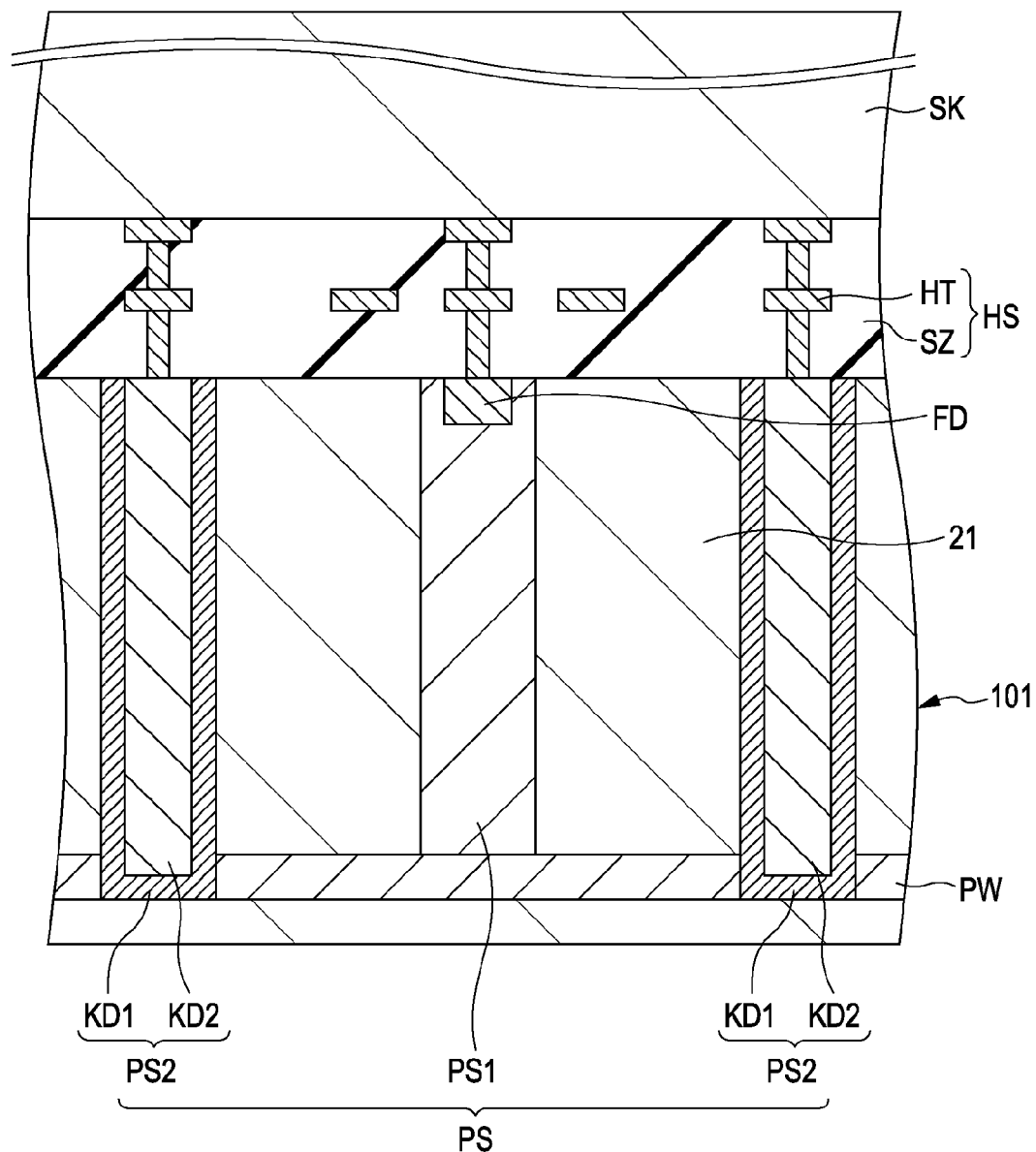
FIG. 11 is a fragmentary view of a principal part formed in a step of the method for manufacturing the solid-state image pickup device 1 of the first embodiment.
Figure 12:
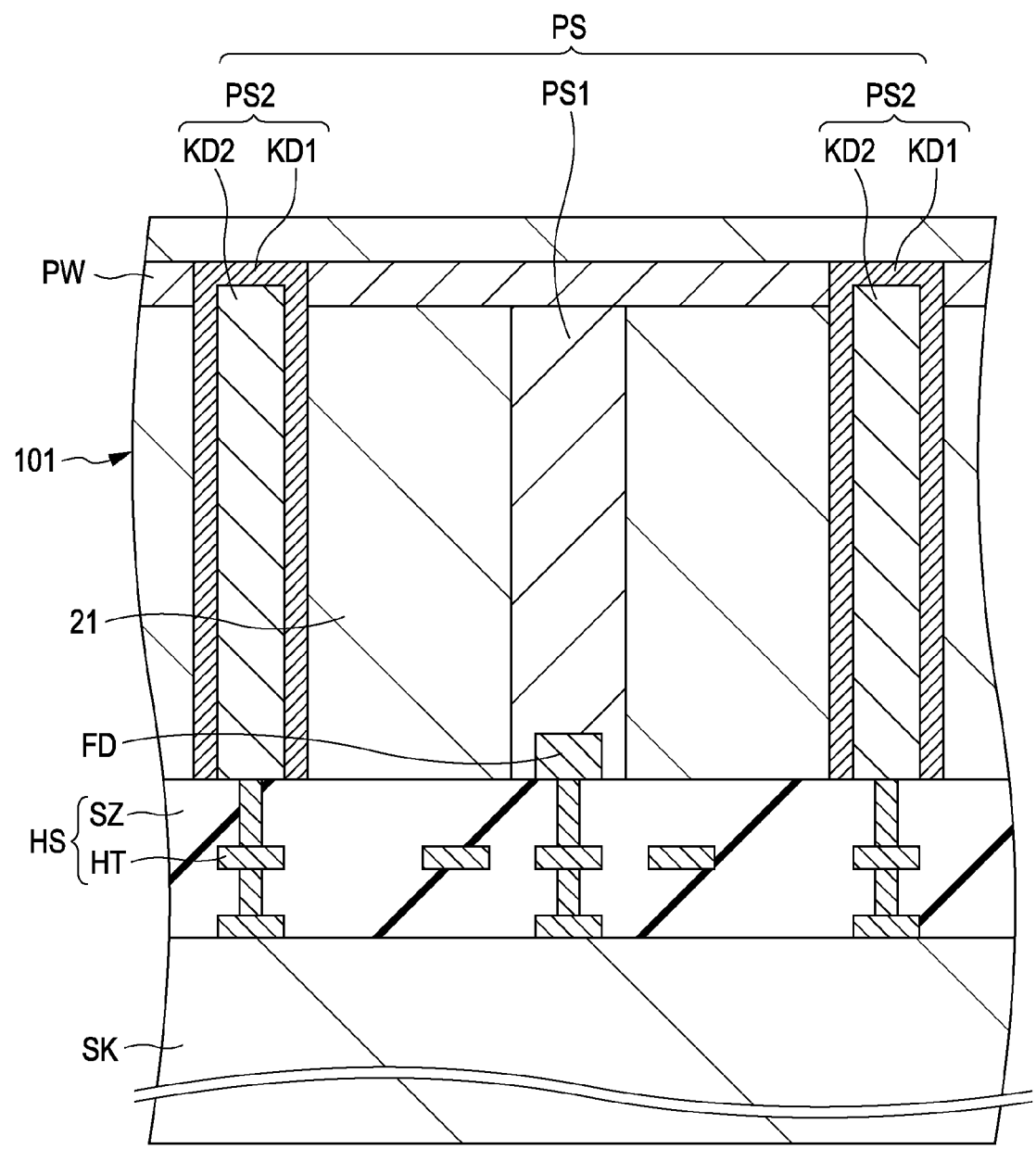
FIG. 12 is a fragmentary view of a principal part formed in a step of the method for manufacturing the solid-state image pickup device 1 of the first embodiment.
Figure 13:
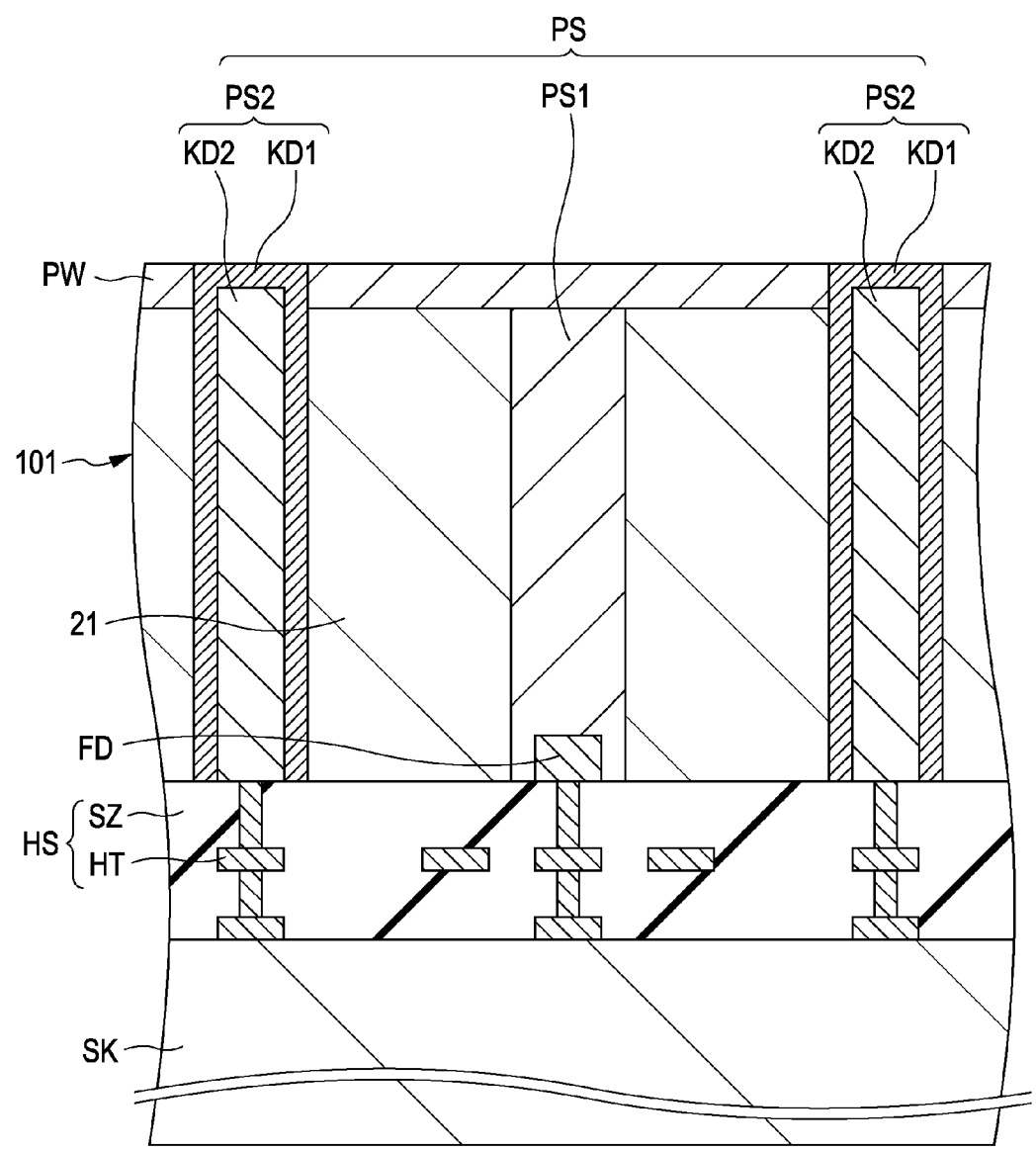
FIG. 13 is a fragmentary view of a principal part formed in a step of the method for manufacturing the solid-state image pickup device 1 of the first embodiment.

6A and 6B to 10A and 10B, views designated by a figure number accompanied with A are sectional views similar to FIG. 4, and views designated by a figure number accompanied with B are top views similar to FIG. 3. FIGS. 11 to 13 are sectional views similar to FIG. 4.

(B-1) Formation of p-Type Impurity Diffusion Region PW

Figure 6A:
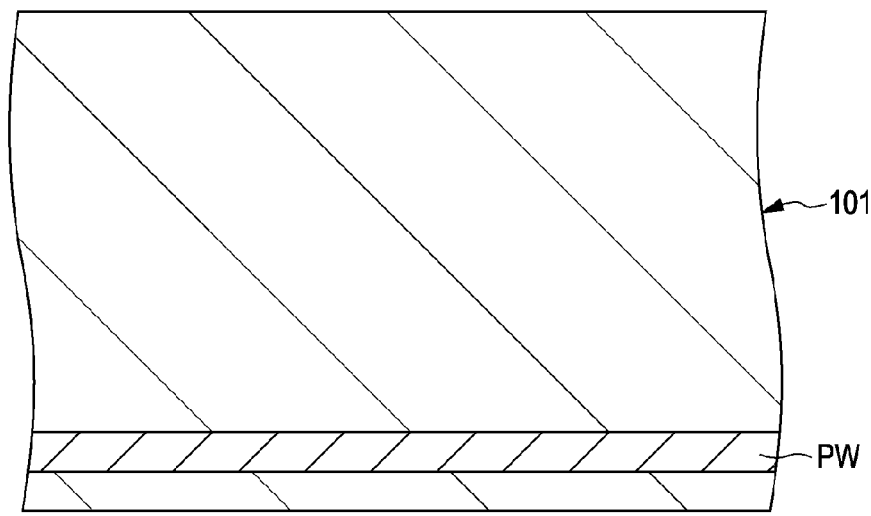
FIGS. 6A and 6B are fragmentary views of principal parts formed in a step of a method for manufacturing the solid-state image pickup device 1 of the first embodiment of the present invention.

First, a p-type impurity diffusion region PW is formed in the substrate 101, as shown in FIG. 6A.

In this step, the silicon semiconductor substrate 101 is subjected to ion implantation of a p-type impurity to form a p-type impurity diffusion region PW in the substrate 101, as shown in FIG. 6A. The p-type impurity region PW is formed under the entire surface of the substrate 101 including the region where the pixels P are formed.

For example, the p-type impurity diffusion region PW can be formed by ion implantation performed under the following conditions.

p-type impurity: B (boron)
Impurity concentration: $1 \times 10^{12}$ to $5 \times 10^{12}$ atoms/cm$^2$
Implantation energy: 1000 to 3000 eV (B-2) Formation of First Pixel Isolation Member PS1

Figure 7A:
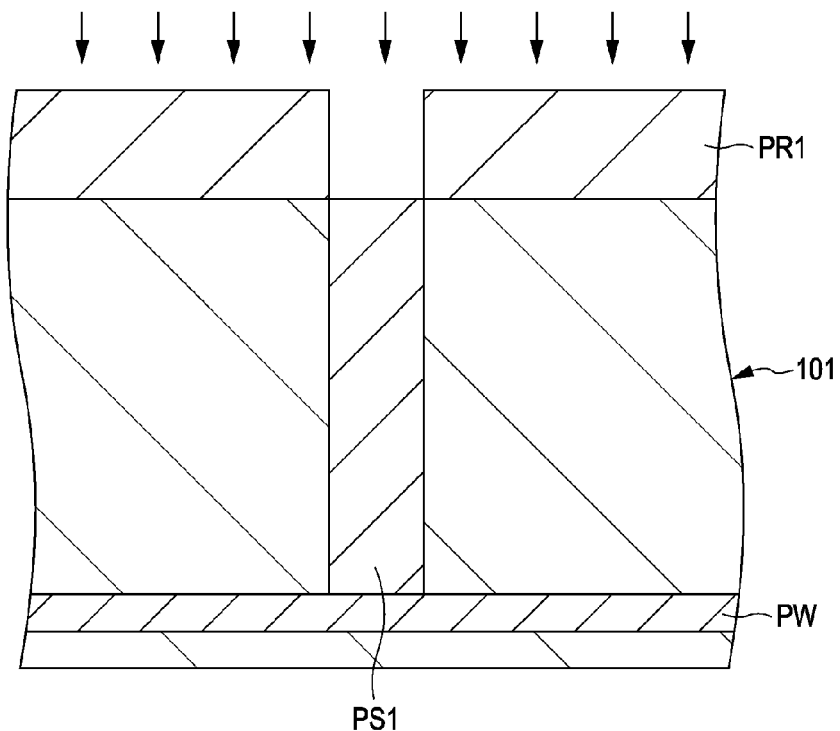
FIGS. 7A and 7B are fragmentary views of principal parts formed in a step of the method for manufacturing the solid-state image pickup device 1 of the first embodiment.
Figure 7B:
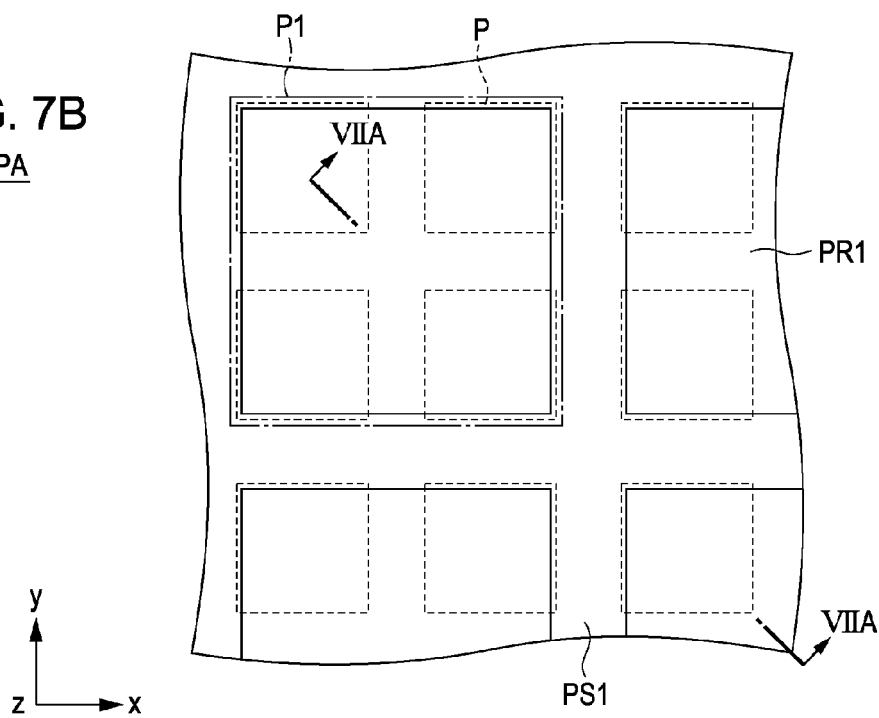

Turning to FIGS. 7A and 7B, the first pixel isolation member PS1 is formed in the substrate 101.

In this step, the first pixel isolation member PS1 is formed from the surface of the substrate 101 in the thickness direction by implanting p-type impurity ions, as shown in FIG. 7A. The first pixel isolation member PS1 is formed so as to partition the first pixel array regions P1, each in which pixels are arranged two by two in the horizontal direction x and the vertical direction y, as shown in FIG. 7B. More specifically, the first pixel isolation member PS1 includes horizontal portions extending in the horizontal direction x and vertical portions extending in the vertical direction y, and the horizontal portions and the vertical portions are formed in a grid manner when viewed from the surface of the substrate 101.

More specifically, a resist pattern PR1 having an opening is formed on the surface of the substrate 101 so that the region of the surface of the substrate 101 in which the first pixel isolation member PS1 is to be formed is exposed in the opening, as shown in FIG. 7A. The resist pattern PR1 is formed so as to cover the first pixel array regions P1, each in which pixels are arranged two by two in the horizontal direction x and the vertical direction y, as shown in FIG. 7B.

For forming the resist pattern PR1, photolithography can be applied. More specifically, a pattern image is formed in a photoresist layer (not shown) formed on the substrate 101 by exposure, and is then developed to form the resist pattern PR1.

For example, the resist pattern PR1 is formed in the following dimensions so that the pixels P can have a width of 1.2 μm:

Thickness: 4.5 μm
Pattern width: 0.86 μm
Opening width: 0.34 μm

Subsequently, the substrate 101 is subjected to ion implantation of a p-type impurity using the resist pattern PR1 as a mask.

For example, the ion implantation is performed to form the first pixel isolation member PS1 under the following conditions:

p-type impurity: B (boron)
Impurity concentration: $1 \times 10^{12}$ to $5 \times 10^{12}$ atoms/cm$^2$
Implantation energy: 50 to 300 eV Thus, the first pixel isolation member PS1 is formed between the surface of the substrate 101 and the p-type impurity diffusion region PW.

Then, the resist pattern PR1 is removed.

(B-3) Formation of Trench TR

Figure 8A:
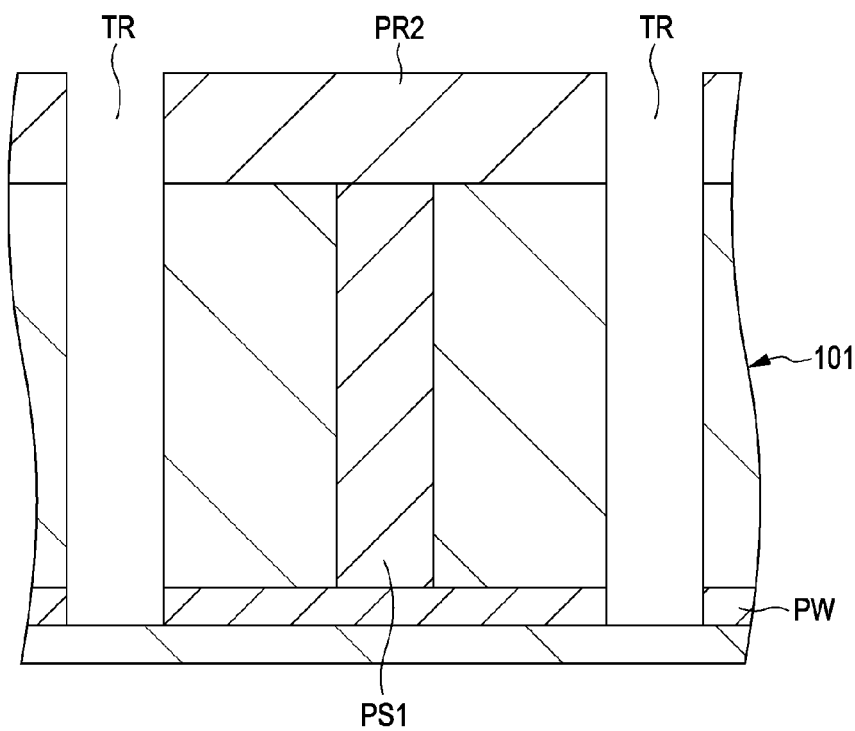
FIGS. 8A and 8B are fragmentary views of principal parts formed in a step of the method for manufacturing the solid-state image pickup device 1 of the first embodiment.
Figure 8B:
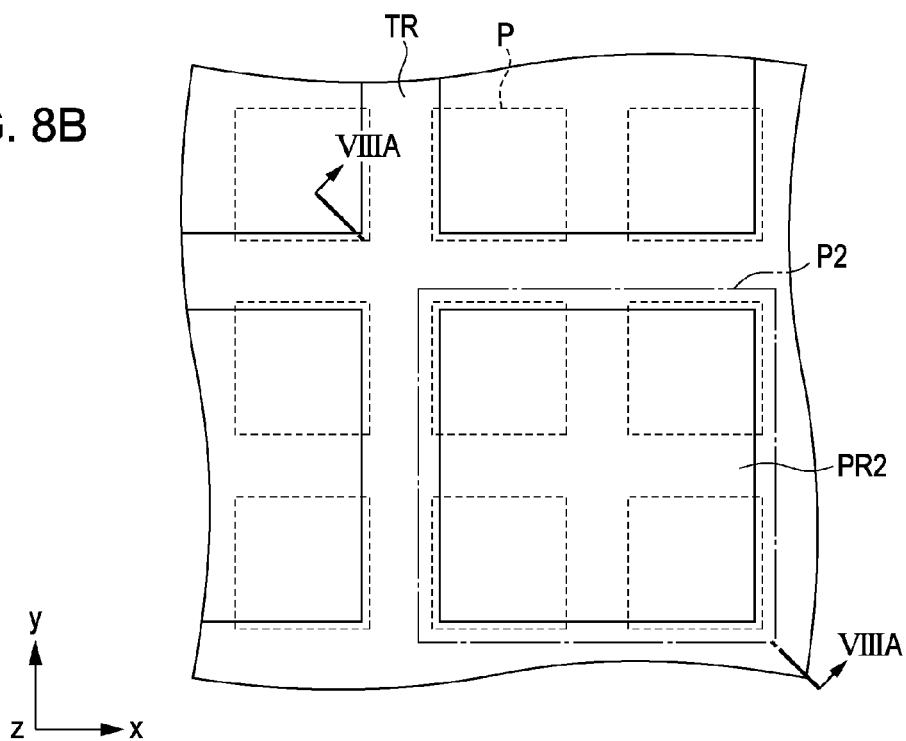

Turning to FIGS. 8A and 8B, a trench TR is formed in the substrate 101 in the region where the second pixel isolation member PS2 is to be formed.

The trench TR is formed by removing the portion of the substrate 101 in which the second pixel isolation member PS2 is to be formed, as shown in FIG. 8A. The trench TR is formed so as to partition the second pixel array regions P2, each in which pixels are arranged two by two in the horizontal direction x and the vertical direction y, as shown in FIG. 8B. Hence, the trench TR is formed in a grid manner when viewed from the surface of the substrate 101.

More specifically, a resist pattern PR2 having an opening is formed on the surface of the substrate 101 so that the region of the surface of the substrate 101 in which the second pixel isolation member PS2 is to be formed is exposed in the opening, as shown in FIG. 8A. The resist pattern PR2 is formed so as to cover the second pixel array regions P2, each in which pixels are arranged two by two in the horizontal direction x and the vertical direction y, as shown in FIG. 8B, when viewed from the surface of the substrate 101.

For example, the resist pattern PR2 is formed in the following dimensions:

Thickness: 4.5 μm
Pattern width: 0.86 μm
Opening width: 0.34 μm

Subsequently, the substrate 101 is etched using the resist pattern PR2 as a mask, and thus the trench TR is formed.

For example, the etching is performed to form the trench TR under the following conditions:

Etching gas and gas flow rate: $C_5F_8/Ar/O_2$=15/500/10 sccm

Then, the resist pattern PR2 is removed.

(B-4) Formation of Second Isolation Member PS2

Figure 9A:
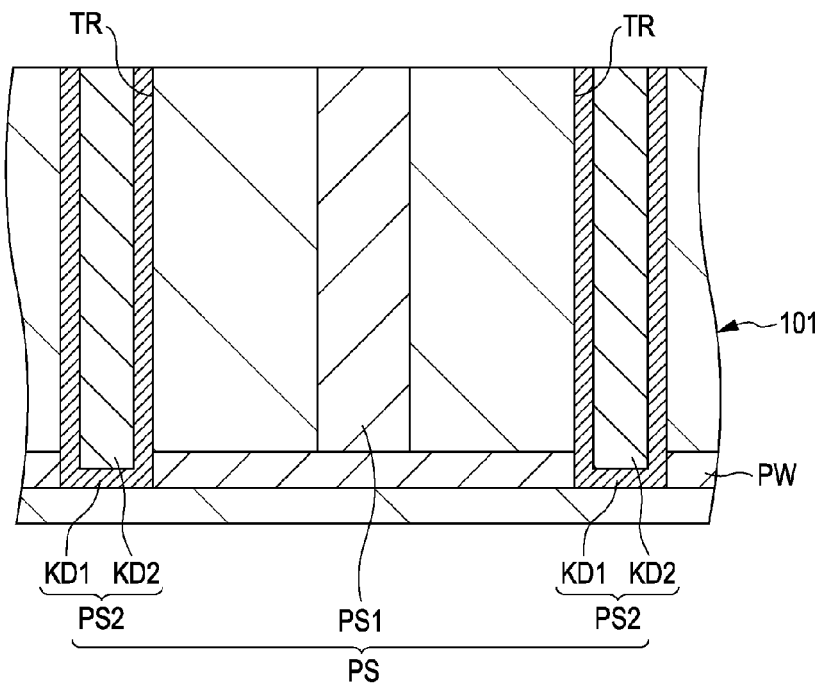
FIGS. 9A and 9B are fragmentary views of principal parts formed in a step of the method for manufacturing the solid-state image pickup device 1 of the first embodiment.
Figure 9B:
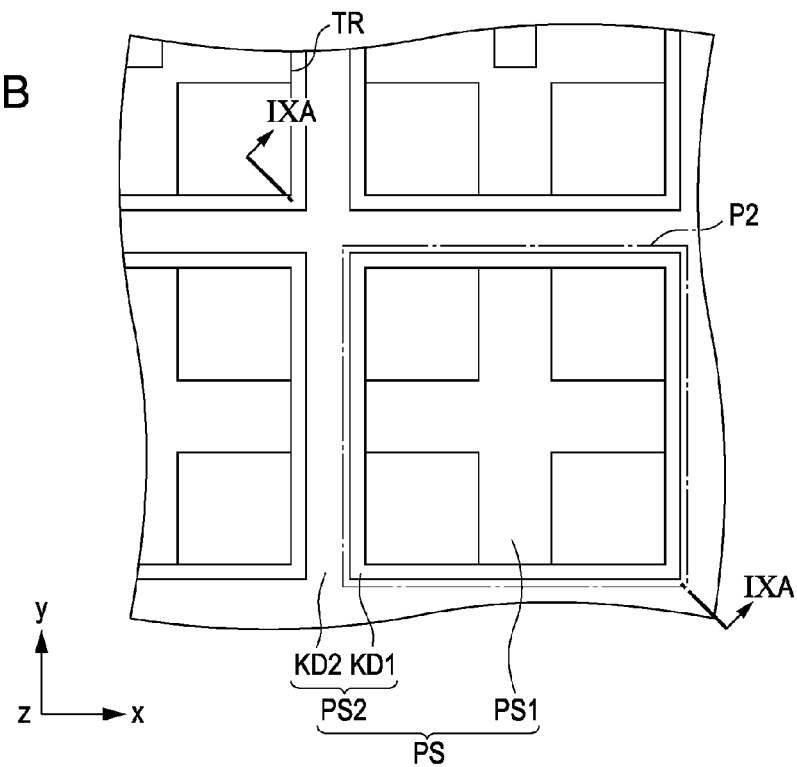

Turning to FIGS. 9A and 9B, the second isolation member PS2 is formed in the substrate 101.

In this step, the second isolation member PS2 is formed in the trench TR in the substrate 101. The first pixel isolation member PS2 is formed in a grid manner so as to partition the second pixel array regions P2, each in which pixels are arranged two by two in the horizontal direction x and the vertical direction y, as shown in FIG. 9B.

In this step, the trench TR is filled with an electroconductive material harder to polish than the substrate 101 in the subsequent step (FIG. 13) of performing CMP to reduce the thickness of the substrate 101.

More specifically, for forming the second pixel isolation member PS2, a first metal layer KD1 and a second metal layer KD2 are formed in that order in the trench TR in the substrate 101, as shown in FIG. 9A.

Also, the first metal layer KD1 is formed over the inner surface of the trench so as to surround each second pixel array region P2, as shown in FIG. 9B. Then, as shown in FIG. 9B, the second metal layer KD2 is formed so as to lie between the lines of the first metal layer KD1 around the second pixel array regions P2 when viewed from the surface of the substrate 101. In the present embodiment, the first metal layer KD1 is formed so as to cover the inner surface of the trench TR, and then the trench TR whose surface is covered with the first metal layer KD1 is filled with the second metal layer KD2, followed by planarization. Thus, the second pixel isolation region PS2 is completed.

For example, the first metal layer KD1 is formed under the following conditions:

Material: tantalum (Ta)
Method: sputtering
Thickness: 15 to 30 nm

For example, the second metal layer KD2 is formed under the following conditions:
Material: copper (Cu)
Method: electroplating
Thickness: 3 to 5 µm (B-5) Formation of Floating Diffusion Portion FD and Photodiodes 21

Figure 10A:
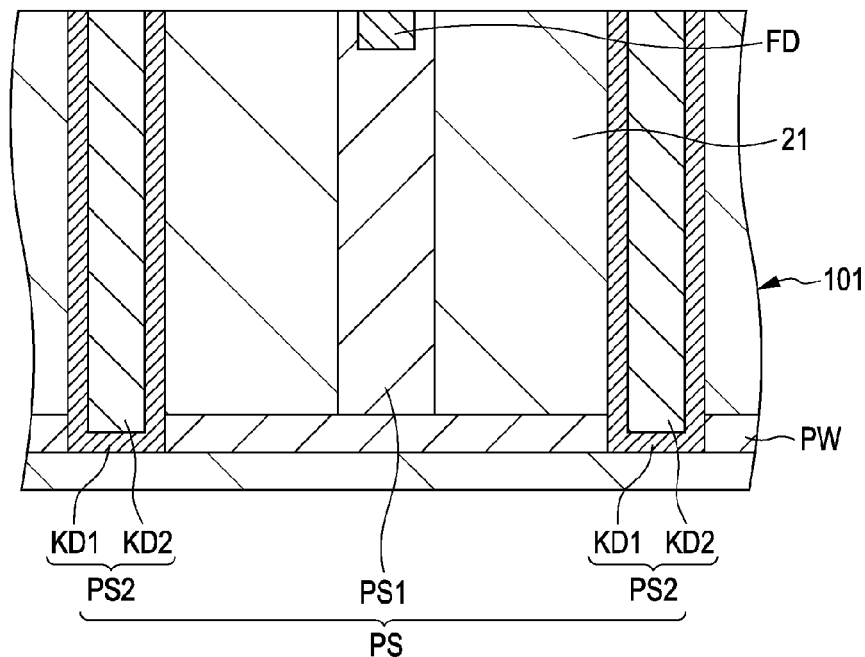
FIGS. 10A and 10B are fragmentary views of principal parts formed in a step of the method for manufacturing the solid-state image pickup device 1 of the first embodiment.
Figure 10B:
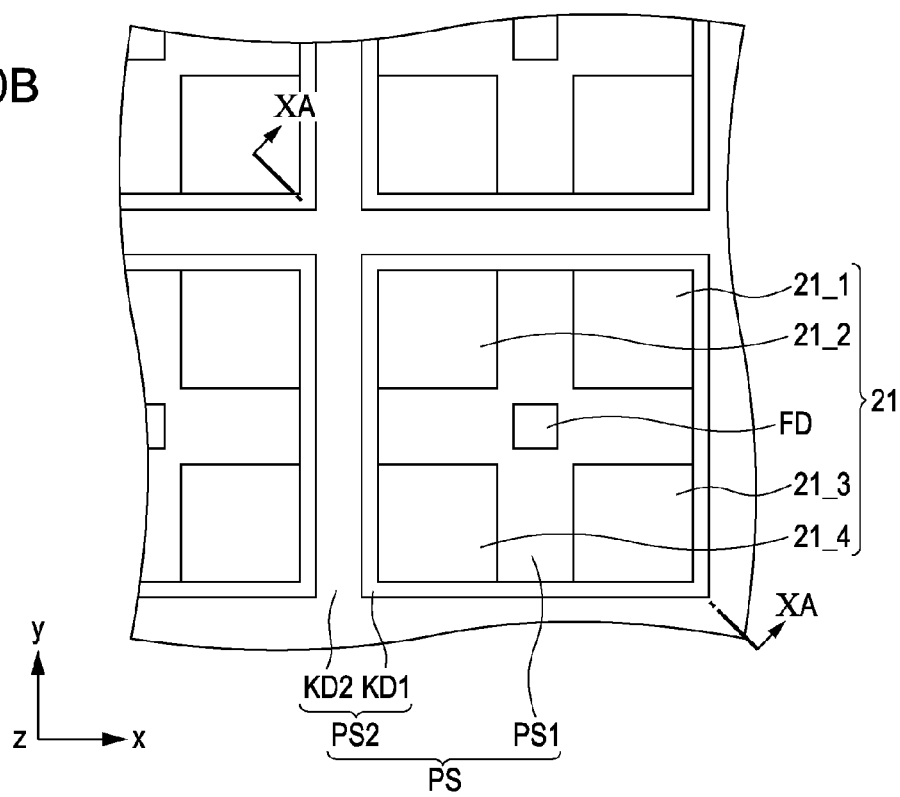

Turning to FIGS. 10A and 10B, the floating diffusion portion FD and the photodiodes 21 are formed in the substrate 101.

In this step, the floating diffusion portions FD are formed in the upper surface of the first pixel isolation member PS1, as shown in FIG. 10A. The floating diffusion portions FD are provided at the intersections of the horizontal portions and the vertical portions of the first pixel isolation member PS1, as shown in FIG. 10B. For example, n-type impurity ions are implanted into the substrate 101 to form the floating diffusion portions FD.

For example, the ion implantation for forming the floating diffusion portions FD may be performed under the following conditions:
Impurity: phosphorus (P)
Impurity concentration: $1\times10^{13}$ to $1\times10^{16}$ atoms/cm$^2$
Implantation energy: 10 to 100 eV In addition, photodiodes 21 are formed between the pixel isolation members PS, as shown in FIG. 10A. The photodiodes 21 are formed in respective unit pixel regions partitioned by the pixel isolation members PS, as shown in FIG. 10B.

More specifically, each photodiode 21 is formed in the substrate 101 by forming an n-type charge storage region (not shown) and a shallow p-type impurity diffusion region (not shown) above the p-type impurity diffusion region PW.

In the present embodiment, the photodiodes 21 are formed in such a manner that four photodiodes 21_1, 21_2, 21_3 and 21_4 are disposed around one floating diffusion portion FD.

For example, the photodiodes 21 are formed by performing ion implantation under the following conditions:
Impurity: arsenic (As)
Impurity concentration: $1\times10^{12}$ to $5\times10^{12}$ atoms/cm$^2$
Implantation energy: 100 to 400 eV (B-6) Formation of Multilayer Wiring Layer HS and Support Substrate SK Turning to FIG. 11, a multilayer wiring layer HS and a support substrate SK are provided on the substrate 101.

After the pixel transistors PTr (not shown in FIG. 11) are formed at the surface of the substrate 101, the multilayer wiring layer HS is formed on the surface of the substrate 101, as shown in FIG. 11. The multilayer wiring layer HS is formed by appropriately forming a plurality of conductor lines HT and a plurality of insulating interlayers SZ. The conductor lines HT are electrically connected to the pixel transistors PTr and the floating diffusion portions FD through the insulating interlayer SZ, and are also formed so as to function as the transfer line 26, the address line 28, the vertical signal line 27, and the reset line 29 shown in FIG. 5.

More specifically, the pixel transistors PTr are formed at the surface of the substrate 101 by forming active regions in the substrate 101 and forming gates of polysilicon. The conductor lines HT of the multilayer wiring layer HS is formed of a metal material, such as aluminum. The insulating interlayer SZ of the multilayer wiring layer HS is formed of, for example, silicon oxide.

Then, the support substrate SK is formed on the surface of the multilayer wiring layer HS. For example, a silicon substrate is bonded to the multilayer wiring layer HS as the support substrate SK.

(B-7) Inversion of substrate 101

Turning to FIG. 12, the substrate 101 is inverted.

In this step, the substrate 101 is inverted so that the surface having the multilayer wiring layer HS and the support substrate SK faces down. Hence, the rear side of the substrate 101 faces up.

(B-8) Reduction of Thickness

Turning to FIG. 13, the thickness of the substrate 101 is reduced.

The thickness of the substrate 101 is reduced by partially removing the rear side (upper surface in FIG. 13) of the substrate 101 by CMP. The second pixel isolation member PS2 extends in the substrate 101 from the front side (lower surface in FIG. 13) to the rear side, as shown in FIG. 13. The second pixel isolation member PS2 has a higher hardness than the substrate 101 and is hard to polish by CMP. The second pixel isolation member PS2 also extends from the front side (lower surface) of the substrate 101 to the rear side (upper surface) of the p-type impurity diffusion region PW. Thus, the thickness of the substrate 101 is reduced until the second pixel isolation member PS2 is exposed using the second pixel isolation member PS2 as a CMP stopper. Consequently, a flat rear surface of the p-type impurity diffusion region PW is exposed.

For example, the above CMP may be performed with silica ($SiO_2$) slurry.

Then, the substrate 101 is provided with a passivation layer (not shown), a color filter (not shown) and an on-chip lens (not shown) on the rear side. Thus, a rear emission CMOS image sensor is completed.

(C) Conclusion

In the present embodiment, the pixel isolation members PS are formed in the substrate 101 that includes pixels P each including a photodiode 21, as shown in FIGS. 7A to 9B. The rear side of the substrate 101 is provided with a passivation layer (not shown), a color filter (not shown) and an on-chip lens (not shown), as shown in FIG. 12.

For forming the first pixel isolation member PS1, impurity ions are implanted into a region in the substrate 101 so that the pixels are disposed between portions of the region when viewed from the surface of the substrate 101, as shown in FIGS. 7A and 7B. More specifically, the first pixel isolation member PS1 is formed so as to partition first pixel array regions P1, each in which pixels are arranged two by two in the horizontal direction x and the vertical direction y.

In addition, the second pixel isolation member PS2 is formed in a different region from the first pixel isolation member PS1 so that the pixels are disposed between portions of the region when viewed from the surface of the substrate 101, as shown in FIGS. 9A and 9B. For forming the second pixel isolation member PS2, a trench TR is formed in the substrate 101 in the region in which the second pixel isolation member PS2 is to be formed, as shown in FIGS. 8A and 8B. Then, the trench is filled with an electroconductive material harder to polish by CMP than the substrate 101 to form the second pixel isolation member PS2, as shown in FIGS. 9A and 9B. In this step, the second pixel isolation member PS2 is formed so as to partition the second pixel array regions, different from the first pixel array regions P1, each in which pixels are arranged two by two in the horizontal direction x and the vertical direction y.

The second pixel isolation member PS2 is used as a CMP stopper when the rear side of the substrate 101 is subjected to CMP for reducing the thickness of the substrate 101.

Since the second pixel isolation member PS2 acts as a CMP stopper in the present embodiment, the thickness of the substrate 101 can be reduced by CMP without variation in thickness of the substrate 101 even if the substrate is not made of expensive SOI.

In the present embodiment, in addition, portions of the first pixel isolation member PS1 extending in the horizontal direction x and portions of the second pixel isolation member PS2 extending in the horizontal direction x are alternately arranged in the vertical direction y. Similarly, portions of the first pixel isolation member PS1 extending in the vertical direction y and portions of the second pixel isolation member PS2 extending in the vertical direction y are alternately arranged in the horizontal direction x.

In the present embodiment, the pixel isolation member PS thus includes plural types of members, and the first and second pixel isolation members PS1 and PS2 are formed through a wide resist pattern. Consequently, the resist pattern can be prevented from, for example, falling down due to stress. Accordingly, a high efficiency in manufacture can be achieved.

In addition, the surface potential of the electroconductive second pixel isolation member PS2 can be controlled to prevent dark current by applying, for example, a negative bias voltage. Furthermore, dark current can be prevented by grounding the second pixel isolation portion PS2.

The solid-state image pickup device of the present invention can be efficiently manufactured at low cost, and can take high-quality images.

2. Second Embodiment

(A) Structure

Figure 14:
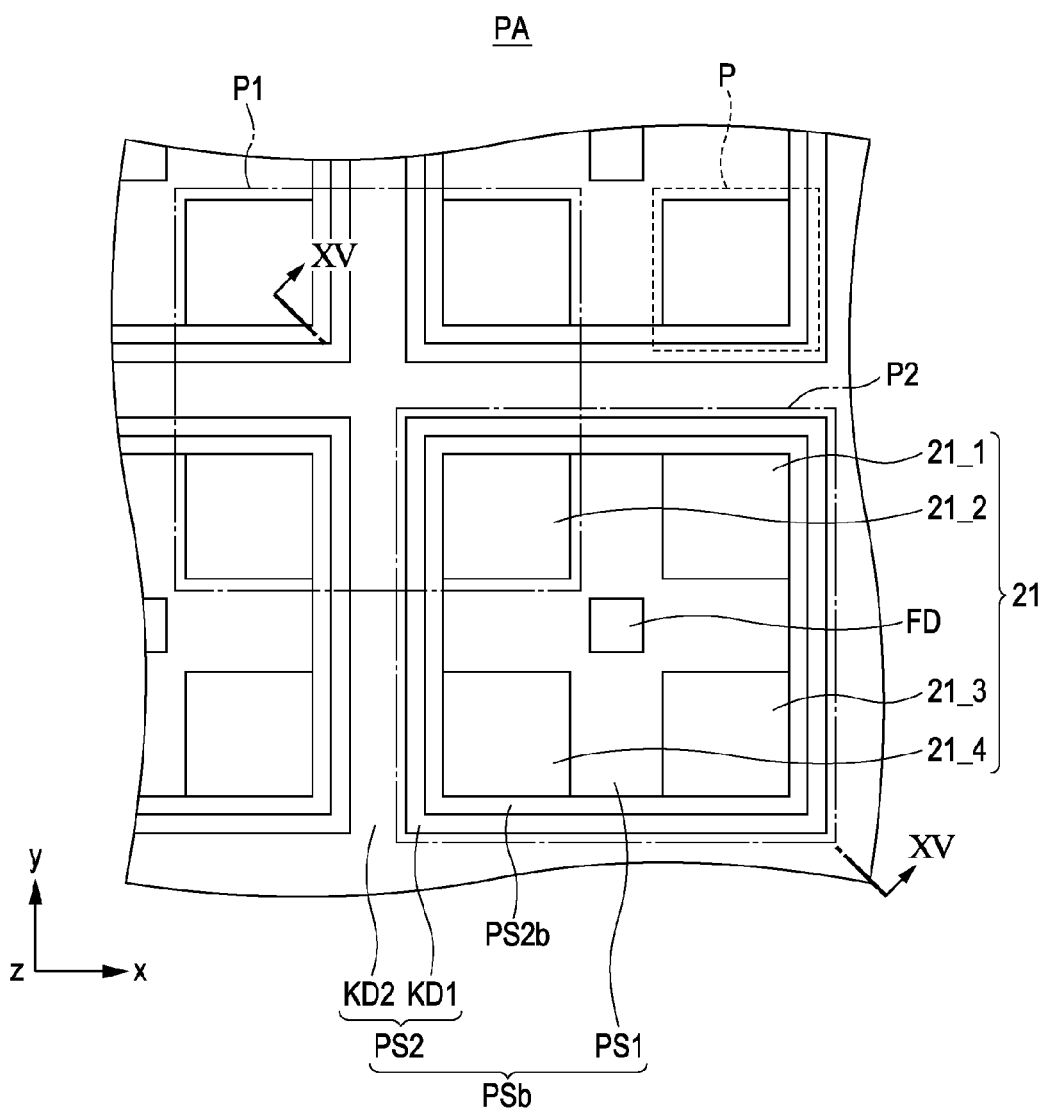
FIG. 14 is a fragmentary view of a principal part of a solid-state image pickup device according to a second embodiment of the present invention.
Figure 15:
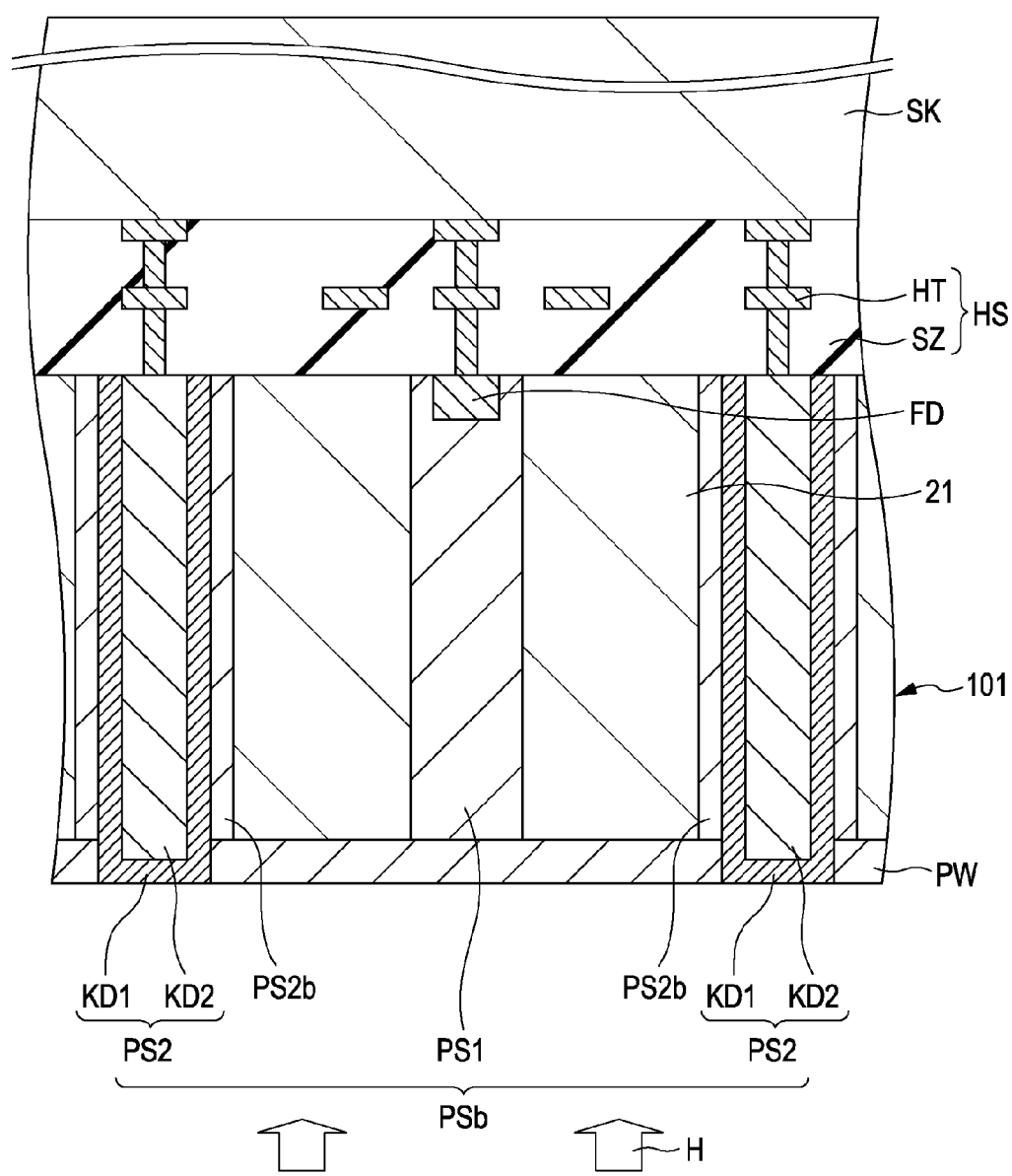
FIG. 15 is a view of a principal part of the image pickup device according to the second embodiment.

FIGS. 14 and 15 are fragmentary views of a principal part of a solid-state image pickup device according to a second embodiment of the present invention.

FIG. 14 is a schematic top view similar to FIG. 3 showing a principal part of an image pickup region PA. FIG. 15 is a schematic sectional view similar to FIG. 4 showing a principal part of the image pickup region PA. FIG. 14 shows the substrate 101 shown in FIG. 15. FIG. 15 shows the section taken along line XV-XV in FIG. 14.

In the present embodiment, the pixel isolation member PSb is different from that of the first embodiment, as shown in FIGS. 14 and 15. The present embodiment is the same as the first embodiment except for the pixel isolation member, and the same descriptions will be omitted.

As shown in FIGS. 14 and 15, the pixel isolation member PSb includes a first pixel isolation member PS1 and a second pixel isolation member PS2, as in the first embodiment. Unlike the first embodiment, however, a p-type impurity diffusion layer PS2b is additionally formed around the second pixel isolation member PS2.

As shown in FIG. 14, the p-type impurity diffusion layer PS2b is formed to the inner sides of the first metal layer KD1 of the second pixel isolation member SP2 so as to surround the second pixel array regions P2 as in the first metal layer KD1 when viewed from the surface of the substrate. Hence, the p-type impurity diffusion layer PS2b is formed as peripheral portions of the second pixel array regions P2 between the second pixel array regions P2 and the second pixel isolation member PS2 when viewed from the surface of the substrate 101.

Also, the p-type impurity diffusion layer PS2b extends in the thickness direction from the surface of the substrate 101, as shown in FIG. 15. In addition, the p-type impurity diffusion layer PS2b covers the surfaces of the first metal layer KD1 at the photodiode sides.

(B) Manufacturing Method

A method for manufacturing the solid-state image pickup device of the present embodiment will now be described.

FIGS. 16A to 18B are views of principal parts formed in respective steps of the method for manufacturing the solid-state image pickup device of the second embodiment. In FIGS. 16A and 16B to 18A and 18B, views designated by a figure number accompanied with A are sectional views similar to FIG. 15, and views designated by a figure number accompanied with B are top views similar to FIG. 14.

(B-1) Formation of P-Type Impurity Diffusion Layer PS2b

Figure 6B:
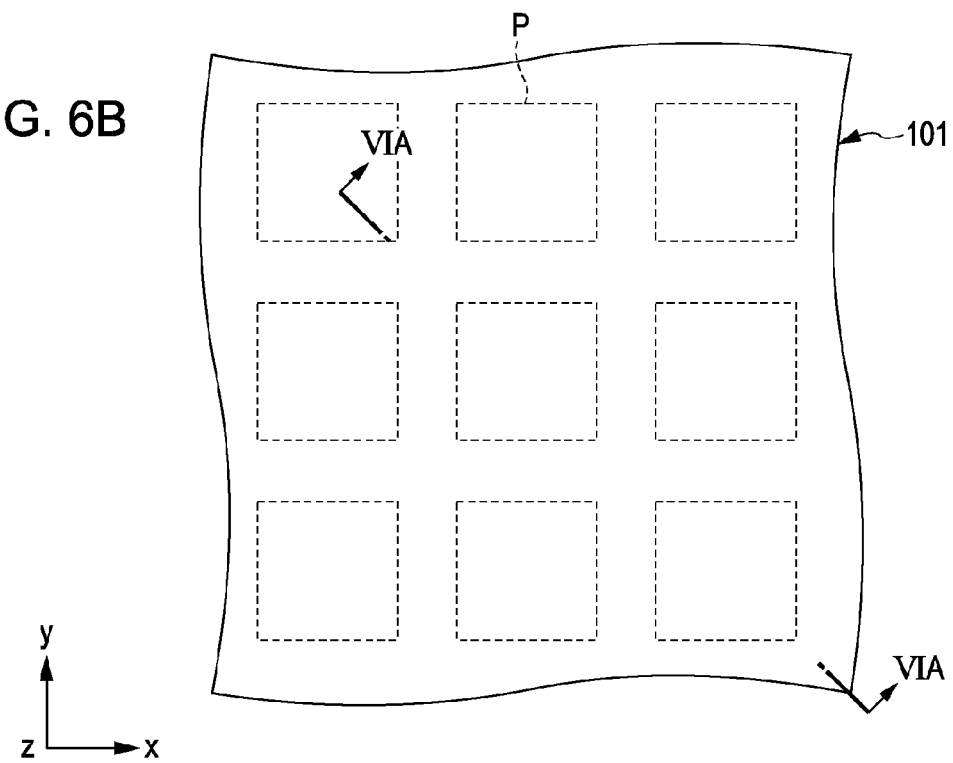

For manufacturing the solid-state image pickup device in the present embodiment, first, a p-type impurity diffusion region PW is formed in the substrate 101 as in the first embodiment (see FIGS. 6A and 6B). Then, a first pixel isolation member PS1 is formed in the substrate 101 (see FIGS. 7A and 7B).

Figure 16A:
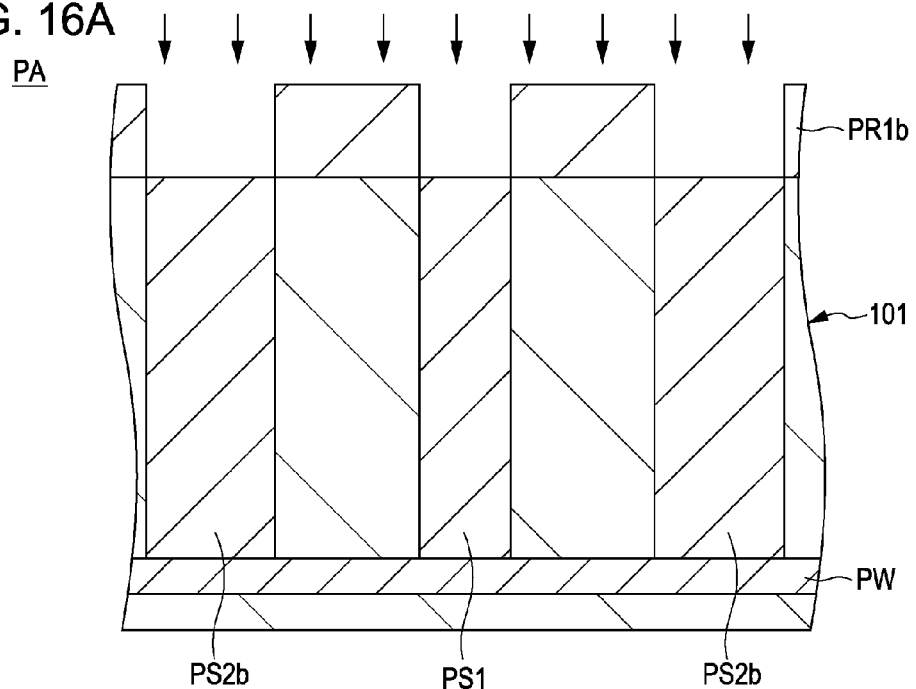
FIGS. 16A and 16B are fragmentary views of principal parts formed in a step of the method for manufacturing the solid-state image pickup device of the second embodiment.
Figure 16B:
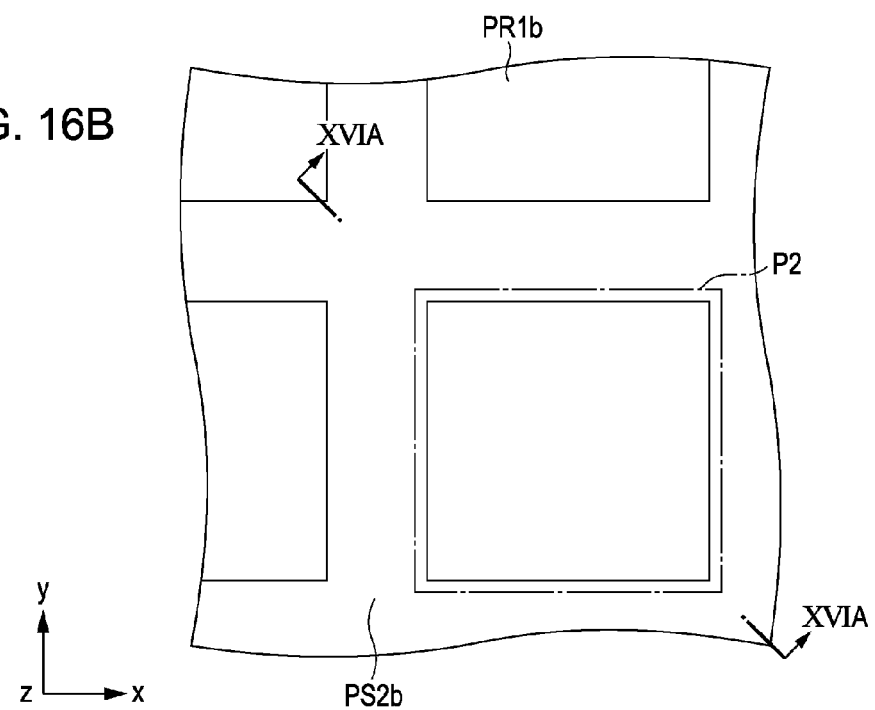

Subsequently, the p-type impurity diffusion layer PS2b is formed in the substrate 101, as shown in FIGS. 16A and 16B.

More specifically, the p-type impurity diffusion layer PS2b is formed from the surface of the substrate 101 in the thickness direction by implanting p-type impurity ions into the substrate 101, as shown in FIG. 16A. The p-type impurity diffusion layer PS2b is formed so as to partition the second pixel array regions P2, each in which pixels are arranged two by two in the horizontal direction x and the vertical direction y, as shown in FIG. 16B.

More specifically, a resist pattern PR1b having an opening is formed on the surface of the substrate 101 so that the region of the substrate 101 in which the p-type impurity diffusion layer PS2b is to be formed is exposed in the opening, as shown in FIG. 16A. More specifically, the resist pattern PR1b is formed on the surface of the substrate 101 by photolithography so as to cover the second pixel array regions P2, as shown in FIG. 16B.

Then, p-type impurity ions are implanted into the substrate 101 using the resist pattern PR1b as a mask. Thus the p-type impurity diffusion layer PS2b is formed from the surface of the substrate 101 to the p-type impurity diffusion region PW. For example, the p-type impurity diffusion layer PS2b is formed by ion implantation under the same conditions as the ion implantation for forming the first pixel isolation member PS1.

Then, the resist pattern PR1b is removed.

(B-2) Formation of Trench TR

Figure 17A:
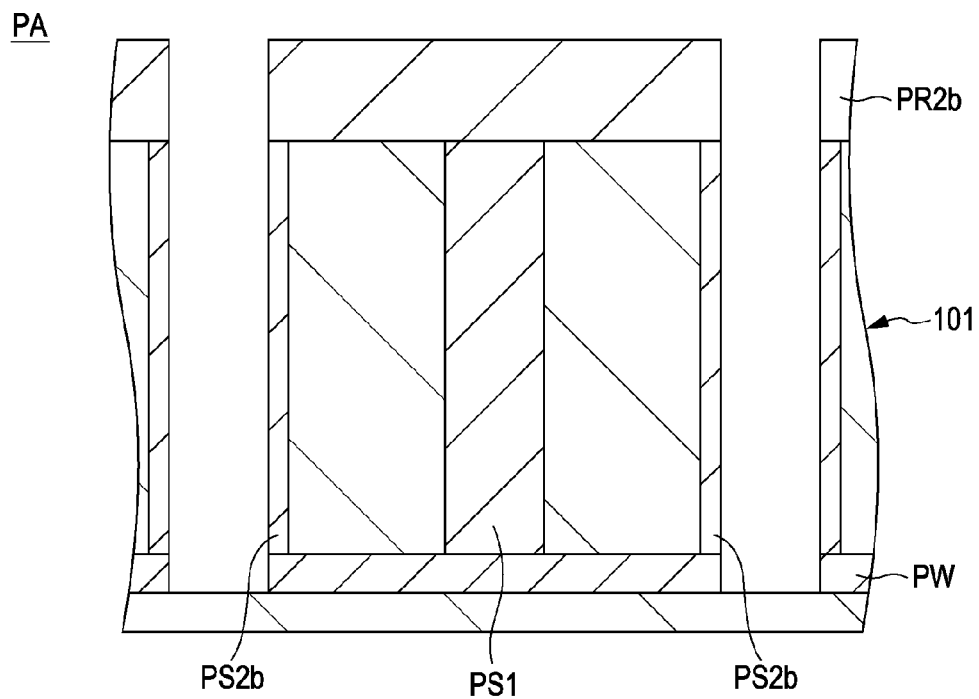
FIGS. 17A and 17B are fragmentary views of principal parts formed in a step of the method for manufacturing the solid-state image pickup device of the second embodiment.
Figure 17B:
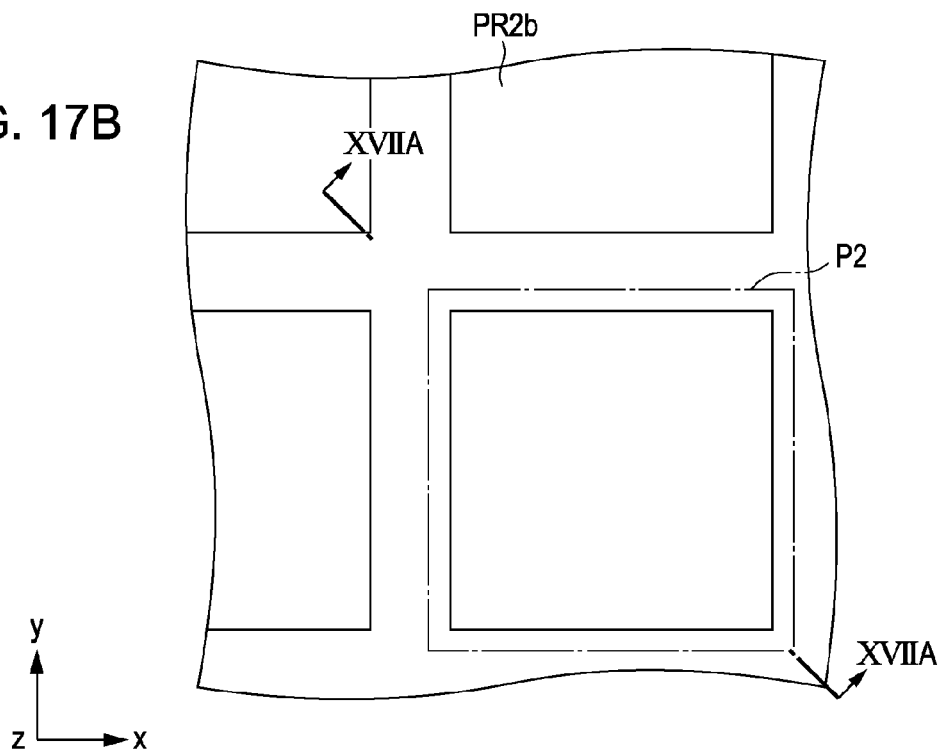

Turning to FIGS. 17A and 17B, a trench TR is formed in the substrate 101 in the region in which the second pixel isolation member PS2 is to be formed.

The trench TR is formed by removing the portion of the substrate 101 in which the second pixel isolation member PS2 is to be formed, as shown in FIG. 17A. The trench TR is formed so as to partition the second pixel array regions P2, each in which pixels are arranged two by two in the horizontal direction x and the vertical direction y, as shown in FIG. 17B.

More specifically, a resist pattern PR2b having an opening is formed on the surface of the substrate 101 so that the region of the substrate 101 in which the second pixel isolation member PS2 is to be formed is exposed in the opening, as shown in FIG. 17A. The resist pattern PR2b is formed so as to cover the second pixel array regions P2, each in which pixels are arranged two by two in the horizontal direction x and the vertical direction y, as shown in FIG. 17B, when viewed from the surface of the substrate 101. Subsequently, the substrate 101 is etched using the resist pattern PR2b as a mask, and thus the trench TR is formed.

For example, the formation of the resist pattern PR2b and the etching of the substrate 101 may be performed under the same conditions as in the formation of the second pixel isolation member PS2 in the first embodiment. Then, the resist pattern PR2b is removed.

(B-3) Formation of Second Pixel Isolation Member PS2

Figure 18A:
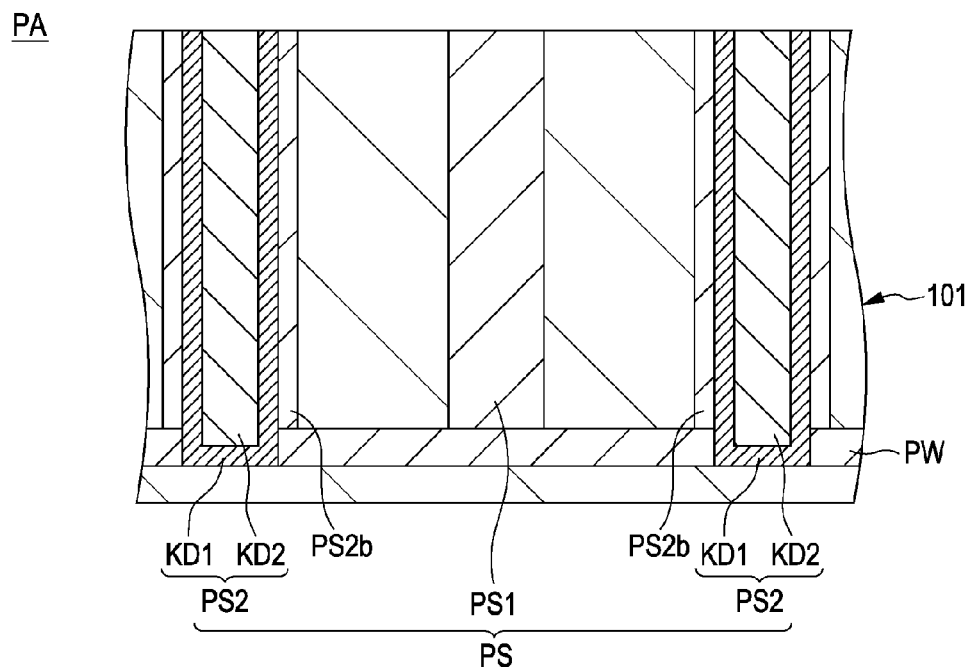
FIGS. 18A and 18B are fragmentary views of principal parts formed in a step of the method for manufacturing the solid-state image pickup device of the second embodiment.
Figure 18B:
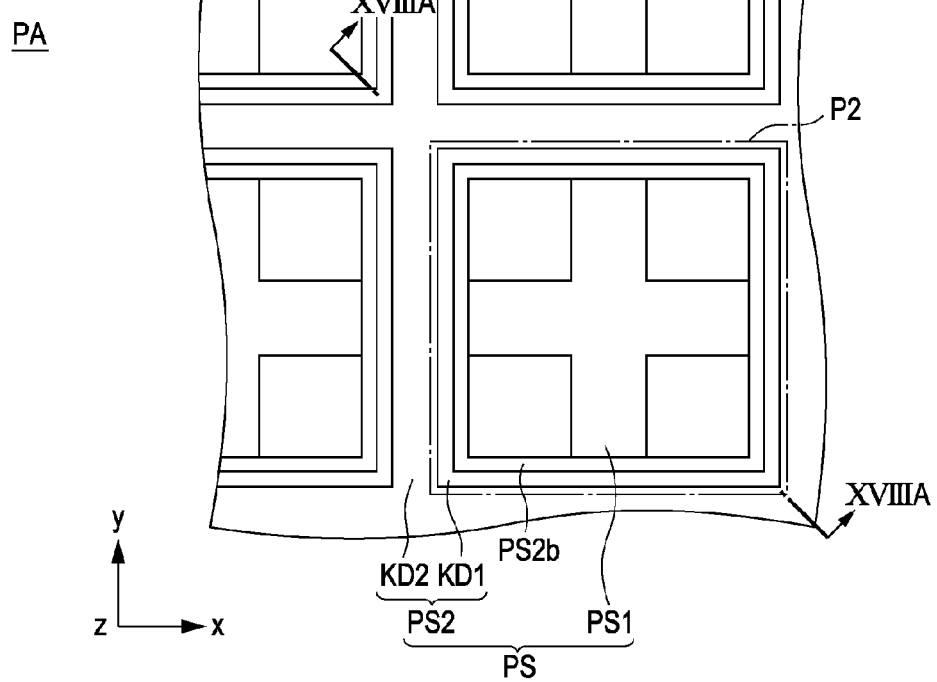
Figure 19A:
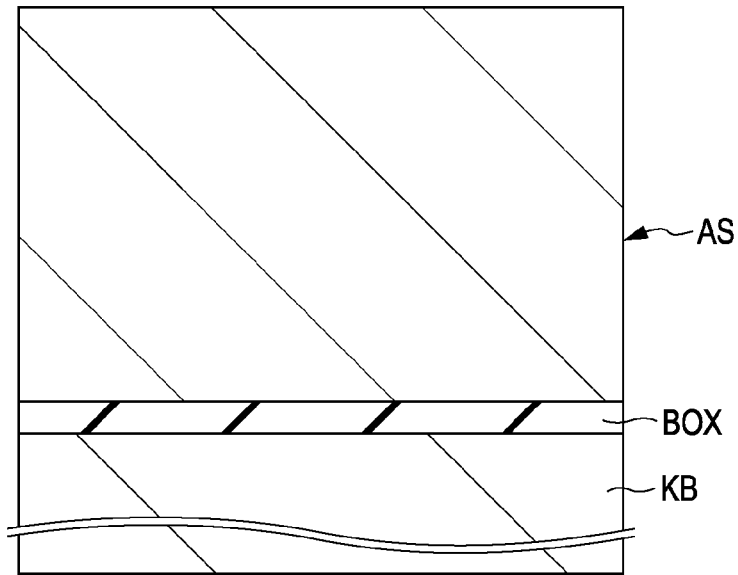
FIGS. 19A and 19B are sectional views of a process for manufacturing a rear emission CMOS image sensor.
Figure 19B:
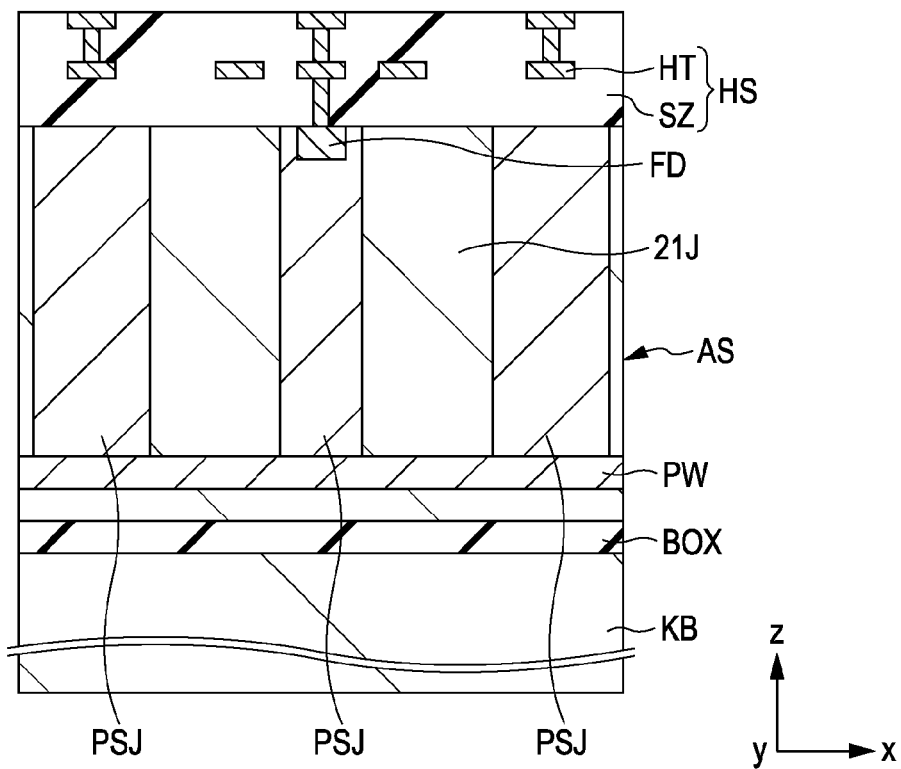
Figure 20A:
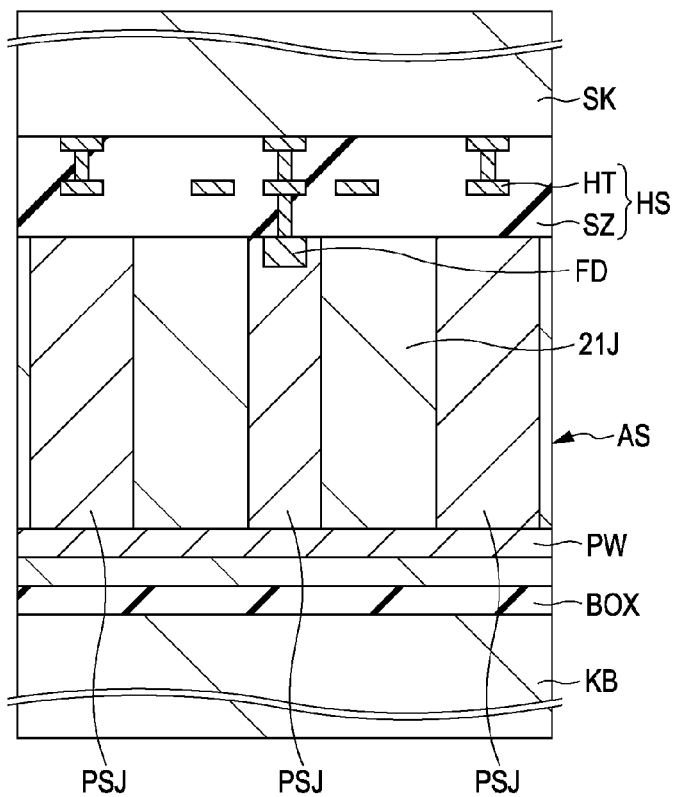
FIGS. 20A and 20B are sectional views of the process for manufacturing the rear emission CMOS image sensor.
Figure 20B:
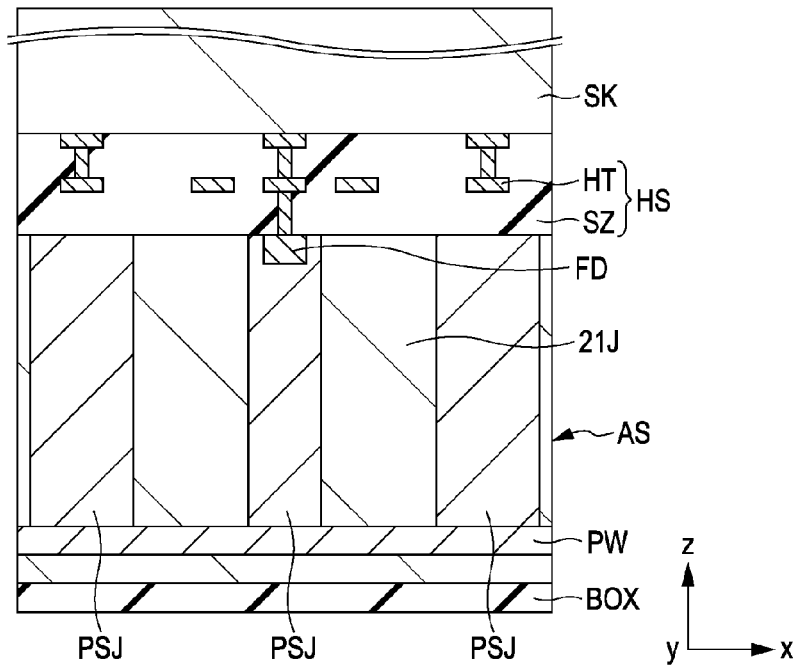

Turning to FIGS. 18A and 18B, the second pixel isolation member PS2 is formed in the substrate 101.

In this step, the second isolation member PS2 is formed in the trench TR in the substrate 101, as shown in FIG. 18A. The second pixel isolation member PS2 is formed in a grid manner so as to partition the second pixel array regions P2, each in which pixels are arranged two by two in the horizontal direction x and the vertical direction y, as shown in FIG. 18B.

More specifically, for forming the second pixel isolation member PS2, a first metal layer KD1 and a second metal layer KD2 are formed in that order in the trench TR in the substrate 101, as shown in FIG. 18A. Also, the first metal layer KD1 is formed over the inner surface of the trench so as to surround each second pixel array region P2, as shown in FIG. 18B. Then, as shown in FIG. 18B, the second metal layer KD2 is formed so as to lie between the lines of the first metal layer KD1 around the second pixel array regions P2 when viewed from the surface of the substrate 101.

For example, after forming the first metal layer KD1, the second metal layer KD2 is formed so as to fill the trench TR whose surface is covered with the first metal layer KD1 under the same conditions as in the first embodiment. Subsequently, the surface of the substrate 101 is planarized by CMP to complete the second pixel isolation member PS2.

(B-4) Formation of Other Members

Subsequently, other members are formed as shown in FIGS. 14 and 15 to complete the solid-state image pickup device.

In this step, the floating diffusion portions FD are formed in the upper surface of the first pixel isolation member PS1, as shown in FIGS. 14 and 15. In addition, photodiodes 21 are formed in the regions surrounded by the pixel isolation members PS.

Then, after forming pixel transistors PTr in the surface of the substrate 101, a multilayer wiring layer HS is formed as shown in FIG. 15. Then, a support substrate SK is formed on the surface of the multilayer wiring layer HS.

These members are formed in the same manner as in the first embodiment.

Then, the substrate 101 is inverted and the thickness of the substrate 101 is reduced in the same manner as in the first embodiment.

In this step, part of the substrate 101 is removed from the rear side by CMP in the same manner as in the first embodiment. In the present embodiment as well as in the first embodiment, the second pixel isolation member PS2 has a higher hardness and is accordingly harder to remove by CMP than the substrate 101. The second pixel isolation member PS2 extends from the surface of the substrate 101 to the rear side of the p-type impurity diffusion region PW as in the first embodiment. Consequently, the thickness of the substrate 101 is reduced to expose the rear side of the p-type impurity diffusion region PW, using the second pixel isolation member PS2 as a stopper as in the first embodiment.

Then, the substrate 101 is provided with a passivation layer (not shown), a color filter (not shown) and an on-chip lens (not shown) on the rear side. Thus, a rear emission CMOS image sensor is completed.

(B) Conclusion

In the present embodiment, for forming the pixel isolation member PS, the first pixel isolation member PS1 and the second pixel isolation member PS2 are formed, as in the first embodiment. The second pixel isolation member PS2 is used as a CMP stopper when the thickness of the substrate is reduced by CMP. The pixel isolation member PS thus includes a plurality of types, and the first and second pixel isolation members PS1 and PS2 are formed through a wide resist pattern.

The solid-state image pickup device of the present invention can be efficiently manufactured at low cost, and can take high-quality images.

3. Modifications

The present invention is not limited to the above-described embodiments, and various modifications may be made.

Although the above embodiments illustrate the case in which the first and second pixel isolation members PS1 and PS2 are formed so as to partition the regions P1 and P2 respectively, each including two-by-two pixels P, the invention is not limited to this form. The pixel isolation members may partition regions each in which at least three pixels P are arranged in one direction. For example, the step of forming part of the pixel isolation member so as to partition regions each in which three pixels are arranged in one direction may be repeated at least three times, thereby forming the pixel isolation members.

Although the above embodiment illustrates the case where the present invention will be applied to cameras, the invention is not limited to this. The present invention may be applied to other electric apparatuses including a solid-state image pickup device, such as a scanner and a copy machine.

Although the above embodiments illustrate structures in which a plurality of photodiodes share pixel transistors, the present invention is not limited to the above form. The present invention may be applied to a case where a set of pixel transistors is provided for each photodiode.

In the above embodiments, four photodiodes share one floating diffusion portion, but the invention is not limited to this form.

The second pixel isolation member PS2 (through-electrode) which is made of an electroconductive material in the above embodiments may be configured so as to be used as a conductor line, such as a reset line.

CMP may be evenly stopped in chips by additionally forming the second pixel isolation member PS2 (through-electrode) in a peripheral circuit portion.

In addition to the above method in which a metal is exposed to stop the polishing, the rear surface of the substrate may be polished by combining SiN and a metal, SiN and polysilicon, and other combinations in addition to the technique in which a metal is exposed to stop the polishing.

The second pixel isolation member PS2 (through-electrode) can be used as an alignment mark for forming a color filter and an on-chip lens that are to be formed on the rear side of the substrate.

The elements or components described in the above embodiments are each a form of the corresponding element of the invention, including the solid-state image pickup device 1, the photodiodes 21 corresponding to photoelectric conversion elements, the camera 40 corresponding to an electronic apparatus, the substrate 101 corresponding to a semiconductor substrate, the floating diffusion portion FD, the pixel P, and the pixel isolation members PS and PSb. Also, the first pixel isolation member PS1 and the second pixel isolation member PS2 are exemplary forms of the first pixel isolation member and the second pixel isolation member of the invention, respectively. The p-type impurity diffusion layer PS2*b* of the above embodiments corresponds to an impurity diffusion region.

The present application contains subject matter related to that disclosed in Japanese Priority Patent Application JP 2009-231462 filed in the Japan Patent Office on Oct. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a solid-state image pickup device, comprising the steps of:
   forming a first pixel isolation member in a semiconductor substrate in which a plurality of pixels each including a photoelectric conversion element are arranged, by implanting impurity ions in a first region of the semiconductor substrate to separate pixels in the first region from each other when viewed from a first surface of the semiconductor substrate;
   forming a second pixel isolation member in the semiconductor substrate by forming a trench in a second region of the semiconductor substrate different from the first region to separate the pixels in the second region from each other, and filling the trench with an electroconductive material harder to polish by chemical mechanical polishing than the semiconductor substrate; and
   reducing the thickness of the semiconductor substrate by chemical mechanical polishing on a rear surface of the semiconductor substrate using the second pixel isolation member as a stopper.

2. The method according to claim 1, wherein:
   the pixels in the first region and the second region are arranged in a first direction and a second direction perpendicular to the first direction when viewed from the first surface of the semiconductor substrate;
   horizontal portions of at least one of the first pixel isolation member and the second pixel isolation member are formed between first boundary lines of the pixels arranged in the first direction; and
   vertical portions of at least one of the first pixel isolation member and the second pixel isolation member are formed between second boundary lines of the pixels arranged in the second direction.

3. The method according to claim 2, wherein:
   the first pixel isolation member is formed so as to surround a first pixel array region including the pixels arranged in the first direction and the second direction;
   the second pixel isolation member is formed so as to surround a second pixel array region including the pixels arranged in the first direction and the second direction; and
   the second pixel array region is different from the first pixel array region.

4. The method according to claim 3, further comprising the step of forming a floating diffusion portion in the first pixel isolation member, the floating diffusion portion reading out a signal charge from the photoelectric conversion element.

5. The method according to claim 4, wherein the first pixel isolation member is formed so as to include a first portion extending in the first direction and a second portion extending in the second direction, and the floating diffusion portion is formed in the first pixel isolation member at an intersection of the first portion and the second portion.

6. The method according to claim 3, wherein the step of forming the second pixel isolation member further includes the sub step of forming an impurity diffusion region around the second pixel array region when viewed from the first surface of the semiconductor substrate.

* * * * *